(12) United States Patent
Kim et al.

(10) Patent No.: US 12,243,485 B2
(45) Date of Patent: Mar. 4, 2025

(54) ORGANIC LIGHT EMITTING DISPLAY APPARATUS

(71) Applicant: LG Display Co., Ltd., Seoul (KR)

(72) Inventors: Jaesung Kim, Uijeongbu-si (KR); JuhnSuk Yoo, Seoul (KR); HoYoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 508 days.

(21) Appl. No.: 17/528,920

(22) Filed: Nov. 17, 2021

(65) Prior Publication Data

US 2022/0173189 A1 Jun. 2, 2022

(30) Foreign Application Priority Data

Dec. 1, 2020 (KR) .................. 10-2020-0165804

(51) Int. Cl.
*G09G 3/325* (2016.01)
*G09G 3/3291* (2016.01)
(Continued)

(52) U.S. Cl.
CPC .......... *G09G 3/325* (2013.01); *G09G 3/3291* (2013.01); *G09G 2230/00* (2013.01);
(Continued)

(58) Field of Classification Search
CPC .......... H10K 59/1213; H10K 59/1216; H10K 59/131; G09G 2230/00; G09G 2300/0852;
(Continued)

(56) References Cited

U.S. PATENT DOCUMENTS 9,123,294 B2 9/2015 Han et al.
9,647,047 B2 5/2017 Jeong et al.
(Continued)

FOREIGN PATENT DOCUMENTS

CN 102956192 A 3/2013
CN 104183215 A 12/2014
(Continued)

OTHER PUBLICATIONS

China National Intellectual Property Administration, Office Action, Chinese Patent Application No. 202111296362.6, Oct. 16, 2023, 24 pages.
(Continued)

*Primary Examiner* — Ratisha Mehta
*Assistant Examiner* — Brad A Knudson
(74) *Attorney, Agent, or Firm* — Fenwick & West LLP

(57) ABSTRACT

According to an aspect of the present disclosure, an organic light emitting display apparatus includes an organic light emitting diode; a driving transistor which supplies a driving current to the organic light emitting diode; and a plurality of switching transistors to transmit a reference voltage and a data voltage to a gate electrode of the driving transistor, respectively. According to the present disclosure, one frame is divided into a refresh period in which a data voltage is written and a hold period in which the data voltage written in the refresh period is held. The refresh period includes an initialization period, a sampling period, a programming period, and an emission period, and the sampling period and the programming period may be separate from each other.

21 Claims, 18 Drawing Sheets

(51) Int. Cl.
*H10K 59/121* (2023.01)
*H10K 59/131* (2023.01)

(52) U.S. Cl.
CPC ............ *G09G 2300/0852* (2013.01); *G09G 2310/0251* (2013.01); *G09G 2320/0233* (2013.01); *G09G 2320/0257* (2013.01); *G09G 2320/045* (2013.01); *H10K 59/1213* (2023.02); *H10K 59/1216* (2023.02); *H10K 59/131* (2023.02)

(58) Field of Classification Search
CPC ... G09G 2310/0251; G09G 2320/0233; G09G 2320/045; G09G 3/3241; G09G 3/3258; G09G 3/3266; G09G 3/3291; G09G 2320/0257; G09G 3/325
See application file for complete search history.

(56) References Cited

U.S. PATENT DOCUMENTS

| | | | |
|---|---|---|---|
| 10,127,859 | B2 | 11/2018 | Chang et al. |
| 10,210,799 | B2 * | 2/2019 | Mao ............... G09G 3/3233 |
| 10,559,261 | B2 | 2/2020 | Chang et al. |
| 10,665,174 | B2 | 5/2020 | Park |
| 10,916,198 | B2 | 2/2021 | Lin et al. |
| 11,282,462 | B2 | 3/2022 | Lin et al. |
| 11,289,008 | B2 | 3/2022 | Chen et al. |
| 11,651,736 | B2 | 5/2023 | Lin et al. |
| 2013/0043802 | A1 * | 2/2013 | Han ............... G09G 3/3233 |
| | | | 315/240 |
| 2013/0113779 | A1 * | 5/2013 | Yoon ............... G09G 3/3233 |
| | | | 345/82 |
| 2014/0347347 | A1 | 11/2014 | Jeong et al. |
| 2015/0243720 | A1 | 8/2015 | Kwon et al. |
| 2016/0379552 | A1 * | 12/2016 | Kim ............... G09G 3/3208 |
| | | | 345/76 |
| 2018/0151129 | A1 | 5/2018 | Park |
| 2018/0190197 | A1 | 7/2018 | Chang et al. |
| 2018/0218677 | A1 | 8/2018 | Qing et al. |
| 2019/0051247 | A1 | 2/2019 | Chang et al. |
| 2019/0066580 | A1 | 2/2019 | Xu |
| 2020/0184893 | A1 | 6/2020 | Dong |
| 2020/0226978 | A1 | 7/2020 | Lin et al. |
| 2020/0243001 | A1 | 7/2020 | Chen et al. |
| 2021/0020109 | A1 * | 1/2021 | Lin ............... G09G 3/3258 |
| 2022/0180812 | A1 | 6/2022 | Lin et al. |
| 2023/0237965 | A1 | 7/2023 | Lin et al. |

FOREIGN PATENT DOCUMENTS

| | | |
|---|---|---|
| CN | 105139807 A | 12/2015 |
| CN | 108206008 A | 6/2018 |
| CN | 108257549 A | 7/2018 |
| CN | 111435587 A | 7/2020 |
| KR | 10-2013-0019620 A | 2/2013 |
| KR | 10-2020-0087711 A | 7/2020 |
| TW | 201822179 A | 6/2018 |
| TW | 202029155 A | 8/2020 |
| TW | 202029174 A | 8/2020 |

OTHER PUBLICATIONS

Japan Patent Office, Office Action, JP Patent Application No. 2021-178817, Oct. 18, 2022, 10 pages.
Korean Intellectual Property Office, Office Action, Korean Patent Application No. 10-2020-0165804, Oct. 29, 2024, 14 pages.

* cited by examiner

ORGANIC LIGHT EMITTING DISPLAY APPARATUS

CROSS-REFERENCE TO RELATED APPLICATION

This application claims the priority of Republic of Korea Patent Application No. 10-2020-0165804 filed on Dec. 1, 2020, in the Korean Intellectual Property Office, the disclosure of which is hereby incorporated by reference in its entirety.

BACKGROUND

Field

The present disclosure relates to an organic light emitting display apparatus, and more particularly, to an organic light emitting display apparatus which ensures a sufficient threshold voltage sensing time to improve an image quality.

Description of the Related Art

An organic light emitting display apparatus which implements various information on a screen is a core technology in an information communication era and is developing to be thin, light, and portable, and have high performance Therefore, an organic light emitting display apparatus which may be manufactured to be light and thin is getting the spotlight. The organic light emitting display apparatus which is a self-emitting device is driven at a low voltage so that it is advantageous not only in terms of power consumption, but also in terms of a high response speed, a high emission efficiency, a large viewing angle, and an excellent contrast ratio. Therefore, the organic light emitting display apparatus is being studied as next generation displays. The organic light emitting display apparatus implements images through a plurality of sub pixels disposed in a matrix. Each of the plurality of sub pixels includes a light emitting diode and a plurality of transistors which independently drives the light emitting diode.

Specific examples of a flat display apparatus may include a liquid crystal display apparatus (LCD), a quantum dot display apparatus (QD), a field emission display apparatus (FED), an organic light emitting display apparatus (OLED), or the like. Among them, the organic light emitting display apparatus which does not require a separate light source and is getting the spotlight as a means for reducing the size of the apparatus and displaying clear colors uses an organic light emitting diode (OLED) which is a self-emitting device. Therefore, the organic light emitting display apparatus has advantages such as a fast response speed, a large contrast ratio, high luminous efficiency, high luminance, and a large viewing angle.

Among the display apparatus, the organic light emitting display apparatus including organic light emitting diodes displays images based on light generated from the light emitting diodes in the pixel to have various advantages. However, erroneous images such as spots, afterimages, or color coordinate changes may sometimes occur during the driving. This may lower a basic high image quality satisfaction of the display apparatus including organic light emitting diodes.

Therefore, various driving techniques for solving the erroneous images are being developed and the improvement of the accuracy of the pixel circuit which controls the emission of the pixel is necessary to improve a quality of the image. For example, the accuracy of the pixel circuit may be improved by compensating for a threshold voltage of a driving transistor included in the pixel circuit.

SUMMARY

In order to solve the above-mentioned problem, an object of the present disclosure is to provide an organic light emitting display apparatus including a pixel circuit which ensures a sufficient compensation time for compensating for a threshold voltage of a driving transistor to improve an image quality of the screen.

Objects of the present disclosure are not limited to the above-mentioned objects, and other objects, which are not mentioned above, can be clearly understood by those skilled in the art from the following descriptions.

According to an aspect of the present disclosure, an organic light emitting display apparatus includes an organic light emitting diode; and a pixel circuit including: a driving transistor configured to supply a driving current to the organic light emitting diode; a plurality of switching transistors configured to transmit a reference voltage and a data voltage to a gate electrode of the driving transistor, respectively; a plurality of emission transistors configured to connect a source electrode and a drain electrode of the driving transistor to a high potential voltage line and an anode electrode of the organic light emitting diode, respectively; and an anode reset transistors configured to transmit a first bias voltage to the anode electrode of the organic light emitting diode.

According to another aspect of the present disclosure, an organic light emitting display apparatus includes a display panel provided with a plurality of pixels including an organic light emitting diode and a pixel circuit, the pixel circuit includes a driving transistor, a first transistor, a second transistor, a third transistor, a fourth transistor, a fifth transistor, and a first capacitor and a second capacitor. The pixel circuit includes a first node which is a gate electrode of the driving transistor, a second node which is a source electrode of the driving transistor, a third node which is a drain electrode of the driving transistor, and a fourth node which is an anode electrode of the organic light emitting diode. The first transistor is configured to supply a reference voltage to the first node in accordance with a first scan signal, the second transistor is configured to control electrical connection between the first node and a data line in accordance with a second scan signal. Further, the third transistor is configured to control electrical connection between the second node and a high potential voltage line in accordance with a first emission signal, the fourth transistor is configured to control electrical connection between the third node and the fourth node in accordance with a second emission signal, the fifth transistor is configured to supply a first bias voltage to the fourth node in accordance with a third scan signal. Further, the first capacitor is disposed between the first node and the second node, and the second capacitor may be located between a high potential voltage line and the second node.

According to still another aspect of the present disclosure, an organic light emitting display apparatus includes a display panel provided with a plurality of pixels including an organic light emitting diode and a pixel circuit. The pixel circuit includes a driving transistor, a first transistor, a second transistor, a third transistor, a fourth transistor, a fifth transistor, a sixth transistor, a seventh transistor, and a first capacitor and a second capacitor. Further, the pixel circuit includes a first node which is a gate electrode of the driving transistor, a second node to which one end of the first capacitor and one end of the second capacitor are connected, a third node which is a drain electrode of the driving transistor, a fourth node which is an anode electrode of the organic light emitting diode, and a fifth node which is a source electrode of the driving transistor. Further, the first transistor is configured to supply a reference voltage to the first node in accordance with a first scan signal, the second transistor is configured to control electrical connection between the first node and a data line in accordance with a second scan signal. Further, the third transistor is configured to control electrical connection between the fifth node and a high potential voltage line in accordance with a first emission signal, the fourth transistor is configured to control electrical connection between the third node and the fourth node in accordance with a second emission signal. Further, the fifth transistor is configured to supply a first bias voltage to the fourth node in accordance with a third scan signal, the sixth transistor is configured to supply second bias voltage to the fifth node in accordance with a fourth scan signal, the seventh transistor is configured to control electrical connection between the second node and the fifth node in accordance with a third emission signal. The first capacitor is disposed between the first node and the second node, and the second capacitor may be located between a high potential voltage line and the second node.

Other detailed matters of the exemplary embodiments are included in the detailed description and the drawings.

According to the exemplary embodiment of the present disclosure, a leakage current of a gate electrode of the driving transistor which may occur during the high speed driving may be reduced and the degradation of the luminance which may occur during the low speed driving may be suppressed. By doing this, the power consumption may be reduced while improving the image quality.

Further, the sampling period and the programming period are separately driven, so that the sampling period operates so as to have a driving time of at least two horizontal scanning times. By doing this, a time to sense the threshold voltage of the driving transistor is sufficiently ensured to improve the reliability of the pixel circuit.

Further, an on-bias stress voltage is applied before sampling a threshold voltage so that the degradation of the luminance caused by a hysteresis of the driving transistor is suppressed to improve the image quality.

The effects according to the present disclosure are not limited to the contents exemplified above, and more various effects are included in the present specification

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
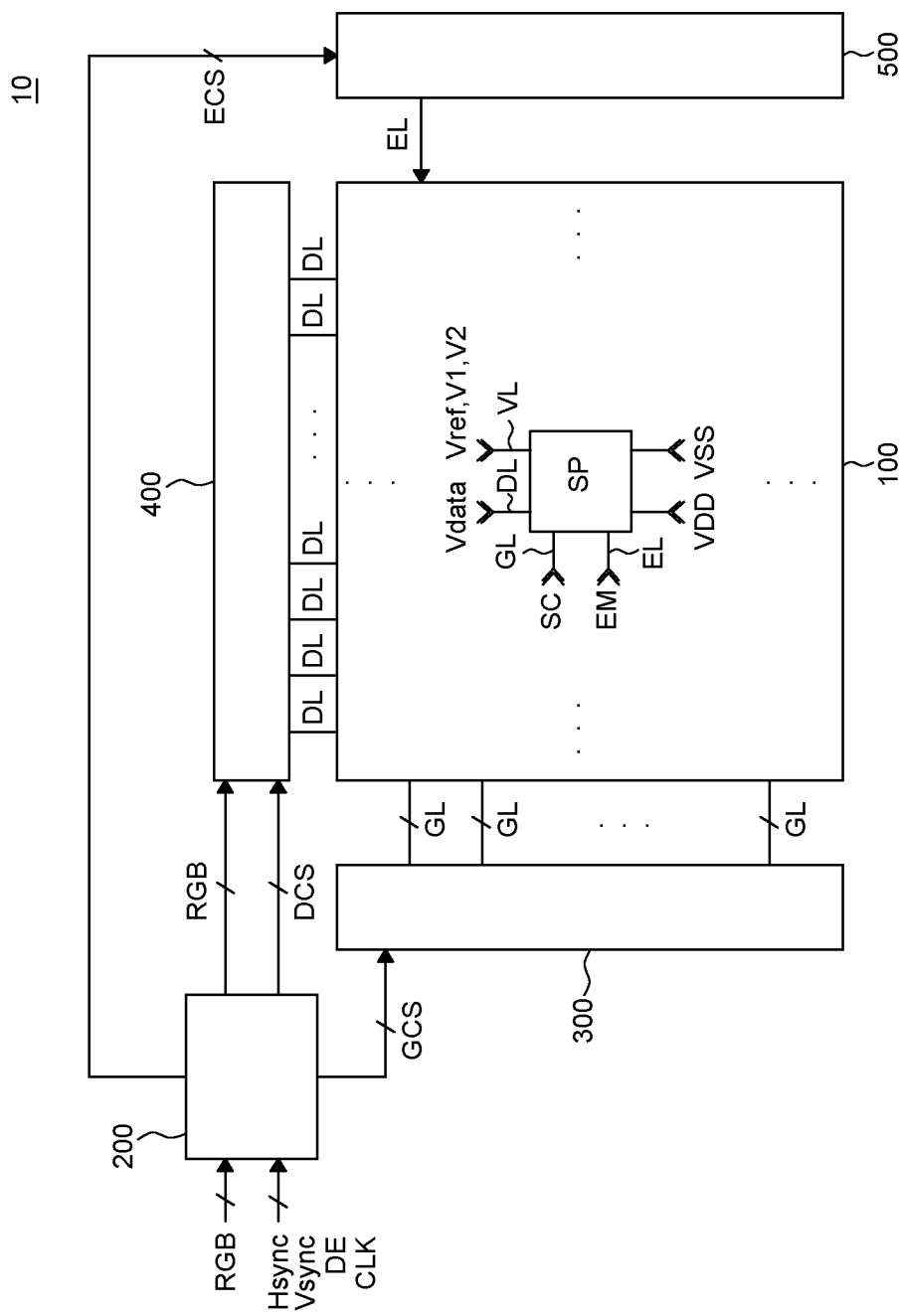
FIG. 1 is a block diagram schematically illustrating an organic light emitting display apparatus according to an exemplary embodiment of the present disclosure.

In the present disclosure, a pixel circuit and a gate driving circuit formed on a substrate of an organic light emitting display apparatus may be implemented by an N type or a P type transistor. For example, a transistor may be implemented by a metal oxide semiconductor field effect transistor (MOSFET). A transistor is a three-electrode element including a gate, a source, and a drain. The source is an electrode which supplies carriers to the transistor. In the transistor, the carriers move from the source to the drain. In the case of the N-type transistor, a carrier is an electron so that the electron moves from the source to the drain and a source voltage is lower than a drain voltage. In the N-type transistor, the electron moves from the source to the drain so that the current is directed to the source from the drain. In the case of the P-type transistor, since the carrier is a hole, the source voltage is higher than the drain voltage so that the hole moves from the source to the drain. The hole of the P-type transistor moves from the source to the drain so that the current is directed to the drain from the source. The source and the drain of the transistor are not fixed, but may be changed in accordance with an applied voltage.

Hereinafter, a gate on voltage may be a voltage of a gate signal by which a transistor may be turned on. A gate off voltage may be a voltage of a gate signal by which a transistor may be turned off. In the P-type transistor, the gate off voltage may be a gate high voltage, and the gate on voltage may be a gate low voltage. In the N-type transistor, the gate off voltage may be a gate low voltage, and the gate on voltage may be a gate high voltage.

Hereinafter, an example of an organic light emitting display apparatus according to an exemplary embodiment of the present disclosure will be described in detail with reference to the accompanying drawings. When reference numerals denote components of each drawing, although the same components are illustrated in different drawings, the same components may be referred to by the same reference numerals as possible. Further, scales of components illustrated in the accompanying drawings are different from the real scales for the convenience of description, so that the scales are not limited to those illustrated in the drawings.

FIG. 1 is a block diagram schematically illustrating an organic light emitting display apparatus according to an exemplary embodiment of the present disclosure.

Referring to FIG. 1, the organic light emitting display apparatus 10 includes a display panel 100 including a plurality of pixels, a gate driver 300 which supplies a gate signal to each of the plurality of pixels, a data driver 400 which supplies a data signal to each of the plurality of pixels, an emission signal generator 500 which supplies an emission signal to each of the plurality of pixels, and a controller 200.

In the display panel 100, a plurality of gate lines GL and a plurality of emission lines EL intersect a plurality of data lines DL and each of the plurality of pixels is connected to a gate line GL, an emission line EL, and a data line DL. Specifically, one pixel is supplied with a gate signal from the gate driver 300 by means of the gate line GL, supplied with a data signal from the data driver 400 by means of the data lines DL, and supplied with an emission signal EM by means of the emission line EL from the emission signal generator 500, and supplied with various powers by means of a power supply line. Here, the gate line GL supplies a scan signal SC, the emission line EL supplies an emission signal EM, and the data line DL supplies a data voltage Vdata. However, according to various exemplary embodiments, the gate line GL may include a plurality of scan signal lines and the data line DL may further include a plurality of power supply lines VL. Further, the emission line EL may include a plurality of emission signal lines. Further, one pixel receives a high potential voltage VDD and a low potential voltage VSS. Further, first and second bias voltages V1 and V2 may be supplied by means of a plurality of power supply lines VL.

Further, each pixel includes an organic light emitting diode OLED and a pixel circuit which controls the driving of the organic light emitting diode OLED. Here, the organic light emitting diode OLED is configured by an anode, a cathode, and an emission layer between the anode and the cathode. The pixel circuit includes a plurality of switching elements, a driving element, and a capacitor. Here, the switching element and the driving element may be configured by a thin film transistor. In the pixel circuit, the driving transistor is configured to control a current amount supplied to the organic light emitting diode OLED in accordance with a difference of a data voltage charged in the capacitor and a reference voltage to adjust an emission amount of the organic light emitting diode OLED. Further, the plurality of switching transistors receives a scan signal SC supplied by means of the gate line GL and an emission signal EM supplied by means of an emission line EL to charge a data voltage Vdata in the capacitor.

The controller 200 processes image data RGB input from the outside to be suitable for a size and a resolution of the display panel 100 to supply the processed image data to the data driver 400. The controller 200 generates a plurality of gate control signals, data control signals, and emission control signals GCS, DCS, and ECS using synchronization signals SYNC input from the outside, for example, a dot clock signal CLK, a data enable signal DE, a horizontal synchronization signal Hsync, and a vertical synchronization signal Vsync. The controller 200 supplies the plurality of generated gate control signals, data control signals, and emission control signals GCS, DCS, and ECS to the gate driver 300, the data driver 400, and the emission signal generator 500, respectively, to control the gate driver 300, the data driver 400, and the emission signal generator 500.

The controller 200 may be configured to be coupled with various processors such as a microprocessor, a mobile processor, or an application processor, depending on a device to be mounted.

The controller 200 generates a signal to allow the pixel to be driven at various refresh rates. That is, the controller 200 generates signals associated with the driving so as to drive the pixel to be switchable to a variable refresh rate (VRR) mode. For example, the controller 200 may drive the pixel at various refresh rates by simply changing a rate of a clock signal, or generating a synchronization signal to generate a horizontal blank or a vertical blank, or driving the gate driver 300 in a mask manner.

The gate driver 300 supplies the scan signals SC to the gate lines GL in accordance with the gate control signal GCS supplied from the controller 200. Even though FIG. 1 illustrates that the gate driver 300 is disposed to be spaced apart from one side of the display panel 100, the number of the gate drivers 300 and a placement position thereof are not limited thereto. That is, the gate driver 300 may be formed in the form of an integrated circuit (IC), or may be formed in the form of a gate in panel GIP which is embedded in the display panel 100. The gate driver 300 may be disposed at a left side and a right side of the display panel 100 or may be disposed at any one side. Further, depending on the type of the display panel 100, the gate driver 300 may be located above or below the display panel 100.

The data driver 400 converts image data RGB into a data voltage Vdata in accordance with the data control signal DCS supplied from the controller 200 and supplies the converted data voltage Vdata to the pixel through the data line DL. The data driver 400 may be formed on the display panel 100 in the form of an integrated circuit (IC) or formed on the display panel 100 in the form of a chip on film (COF). Further, the data driver 400 may be connected to the bonding pad of the display panel 100 by a chip on polyimide (COP) method or may be directly disposed on the display panel 100. In some cases, the data driver 400 may be disposed to be integrated with the display panel 100.

The emission signal generator 500 generates an emission signal EM under the control of the controller 200. The emission signal generator 500 sequentially supplies the emission signal EM to the emission lines EL. The gate driver 300 and the emission signal generator 500 include a plurality of stages to supply signals to the gate lines GL and the emission lines EL.

The controller 200 receives digital video data of an input image and a timing signal which is synchronized with the digital video data, from the host system. The timing signal may include a data enable signal, a vertical synchronization signal, a horizontal synchronization signal, and a clock signal. The host system may be a television (TV) system, a set top box, a navigation system, a DVD player, a Blu-ray player, a personal computer, a home theater system, or a mobile information device.

The controller 200 generate a data control signal DCS, a gate control signal GCS, and an emission control signal ECS, based on the timing signal received from the host system. The data control signal DCS is a signal for controlling an operation timing of the data driver 400, the gate control signal GCS is a signal for controlling an operation timing of the gate driver 300, and the emission control signal ECS is a signal for controlling an operation timing of the emission signal generator 500. The gate control signal GCS and the emission control signal ECS include a start pulse, a shift clock, or the like. In each shift register of the gate driver 300 and the emission signal generator 500, a start timing at which a first output signal is generated may be defined. The shift register starts to be driven when a start pulse is input to generate a first output signal at a first clock timing. A shift clock controls an output shift timing of the shift register.

A period when the gate signal and the data signal are applied to all the pixels disposed in a column direction in the display panel 100 once may be referred to as one frame period. One frame period may be divided into a scan period in which data is scanned to pixels in each gate line GL connected to the pixels to write data of an input image into the pixels, and an emission period in which the pixels are repeatedly turned on and off in accordance with the emission signal EM after the scan period. The scan period may include an initialization period, a sampling period, and the like. Further, the sampling period may include a programming period. During the scan period, nodes included in the pixel circuit are initialized, a threshold voltage of the driving transistor is compensated, and a data voltage is charged. During the emission period, a light emitting operation is performed. The scan period is merely several horizontal scanning periods, and most of one frame period is occupied by the emission period.

The higher the resolution of the display panel 100, the more the number of pixels disposed in the column direction so that one horizontal scanning time (1H time) is reduced. Further, the higher the frequency of the display panel with the same resolution, the shorter one horizontal scanning time (1H time). When one horizontal scanning time (1H time) is reduced, the scan period is reduced so that it is difficult to ensure a time for accurately compensating for the threshold voltage of the driving transistor. Accordingly, a pixel circuit which is capable of accurately compensating for the threshold voltage of the driving transistor even though the resolution and/or the frequency of the display panel is increased will be described below.

Figure 2:
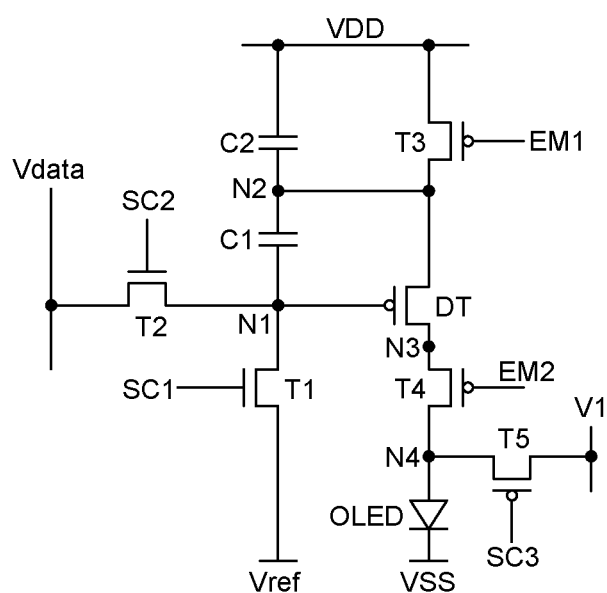
FIG. 2 is a circuit diagram of a pixel circuit of an organic light emitting display apparatus according to an exemplary embodiment of the present disclosure.

FIG. 2 is a circuit diagram of a pixel circuit of an organic light emitting display apparatus according to an exemplary embodiment of the present disclosure.

Referring to FIG. 2, a pixel circuit which supplies a driving current to an organic light emitting diode OLED may include an organic light emitting diode OLED, a driving transistor DT, a first transistor, a second transistor, a third transistor, a fourth transistor, a fifth transistor T1 to T5, and a first capacitor and a second capacitor C1 and C2. Each pixel circuit includes main nodes including a first node N1 connected to a gate electrode of the driving transistor DT, a second node N2 connected to a source electrode of the driving transistor DT, a third node N3 connected to a drain electrode of the driving transistor DT, and a fourth node N4 corresponding to an anode electrode of the organic light emitting diode OLED. The pixel circuit according to an exemplary embodiment of the present disclosure is an internal compensation circuit which compensates for a threshold voltage of the driving transistor DT.

The pixel circuit is applied with a power voltage including a high potential voltage VDD, a low potential voltage VSS that is less than the high potential voltage VDD, a reference voltage Vref, and a first bias voltage V1, a gate signal including a first scan signal SC1, a second scan signal SC2, a third scan signal SC3, a first emission signal EM1 and a second emission signal EM2, and a driving signal of the data voltage Vdata.

The scan signals SC1, SC2, and SC3 and the emission signals EM1 and EM2 have an on-level or an off-level in accordance with a predetermined time interval. The transistors according to the exemplary embodiment of the present disclosure are implemented by a PMOS transistor and an NMOS transistor. A turn-on voltage of the PMOS transistor is a gate low voltage (or an on-level pulse) and a turn-off voltage of the PMOS transistor is a gate high voltage (or an off-level pulse). A turn-on voltage of the NMOS transistor is a gate high voltage (or an on-level pulse) and a turn-off voltage of the NMOS transistor is a gate low voltage (or an off-level pulse).

The organic light emitting diode OLED is supplied with a current which is adjusted by the driving transistor DT in accordance with the data voltage Vdata to emit light and express a luminance corresponding to a data gray scale level of an input image. The organic light emitting diode OLED may include an anode electrode, a cathode electrode, and an emission layer disposed between the anode electrode and the cathode electrode. The emission layer may include an organic emission layer, a hole injection layer, a hole transport layer, an electron transport layer, and an electron injection layer, but is not limited thereto. The anode electrode of the organic light emitting diode OLED may be connected to the driving transistor or an emission transistor which controls the organic light emitting diode OLED to emit light. Further, the cathode electrode of the organic light emitting diode OLED is connected to the low potential voltage line to which a low potential voltage VSS is applied. The anode electrode and the emission layer may be disposed in each pixel and the cathode electrode may be commonly disposed in a plurality of pixels.

The driving transistor DT is a driving element which adjusts a current flowing through the organic light emitting diode OLED in accordance with a gate-source voltage Vgs and is implemented by a PMOS transistor. The driving transistor DT includes a gate electrode connected to the first node N1, a source electrode connected to the second node N2, and a drain electrode connected to the third node N3.

The first transistor T1 is turned on by the first scan signal SC1 to supply a reference voltage Vref to the first node N1. The first transistor T1 is connected to the reference voltage line to which the reference voltage Vref is supplied and the first node N1.

The second transistor T2 is turned on by the second scan signal SC2 to supply a data voltage Vdata to the first node N1. The second transistor T2 is connected to the data line to which the data voltage Vdata is supplied and the first node N1.

The first transistor T1 and the second transistor T2 may also be referred to as switching transistors.

The third transistor T3 is turned on by the first emission signal EM1 to supply a high potential voltage VDD to the second node N2. The third transistor T3 is connected to the high potential voltage line to which the high potential voltage VDD is supplied and the second node N2.

The fourth transistor T4 is turned on by the second emission signal EM2 to supply a driving current supplied from the driving transistor DT to the anode electrode of the organic light emitting diode OLED. The fourth transistor T4 is connected to the third node N3 and the fourth node N4.

The third transistor T3 and the fourth transistor T4 may also be referred to as emission transistors.

The fifth transistor T5 is turned on by the third scan signal SC3 to supply a first bias voltage V1 to the fourth node N4. The fifth transistor T5 is connected to the fourth node N4 and a first bias voltage line to which the first bias voltage V1 is supplied. The fifth transistor T5 may also be referred to as an anode reset transistor.

The first capacitor C1 includes two electrodes to form a first capacitance and two electrodes are connected to the first node N1 and the second node N2, respectively.

The second capacitor C2 includes two electrodes to form a second capacitance and two electrodes are connected to the second node N2 and the high potential voltage line to which the high potential voltage VDD is supplied, respectively.

As described above, the first capacitor C1 serving as a storage capacitor may be formed between the first node N1 which is the gate electrode of the driving transistor DT and the second node N2, and the second capacitor C2 may be formed between the second node N2 and the high potential voltage line. One of both ends of the second capacitor C2 is connected to the high potential voltage line which supplies the high potential voltage VDD to suppress the voltage variation of the second node N2.

Referring to FIG. 2, the first transistor T1 and the second transistor T2, among a first transistor, a second transistor, a third transistor, a fourth transistor, a fifth transistor T1 to T5, may be NMOS transistors. Further, the driving transistor DT and each of the third transistor, the fourth transistor and the fifth transistor T3 to T5 may be PMOS transistors.

According to the exemplary embodiments of the present disclosure, the operation reliability and a current supplying performance are very important so that the driving transistor DT, the emission transistors T3 and T4, and the anode reset transistor T5 are designed by PMOS transistors which are advantageous for the operation reliability and the current supplying performance.

Further, the driving transistor DT, the emission transistors T3 and T4, and the anode reset transistor T5 which require an excellent electron mobility may be low-temperature polycrystalline silicon thin film transistors (LTPS TFT). Accordingly, the current driving performance of the driving transistor DT, the emission transistors T3 and T4, and the anode reset transistor T5 may be improved.

Further, the switching transistors T1 and T2 may be transistors in which switching speed is more important than the current supplying performance. Accordingly, the first transistor T1 and the second transistor T2 may be designed by NMOS transistors which have fast switching speed due to a high carrier mobility. For example, an active layer of the NMOS transistor may be an oxide semiconductor having one or more of indium, gallium, and zinc as a main component. By doing this, the driving performance of the pixel circuit may be greatly improved.

Further, the switching transistors T1 and T2 connected to the first capacitor C1 and the gate electrode of the driving transistor DT are implemented by the NMOS transistors so that a leakage current which may be generated in the gate electrode of the driving transistor DT is reduced. By doing this, the organic light emitting diode OLED may maintain the same luminance for one frame. Further, the configuration of the gate driver 300 is simplified to reduce a bezel area of the display panel 100.

FIGS. 3A to 3D are waveforms illustrating driving steps of a pixel circuit during a refresh period in an organic light emitting display apparatus according to an exemplary embodiment of the present disclosure.

Figure 4A:
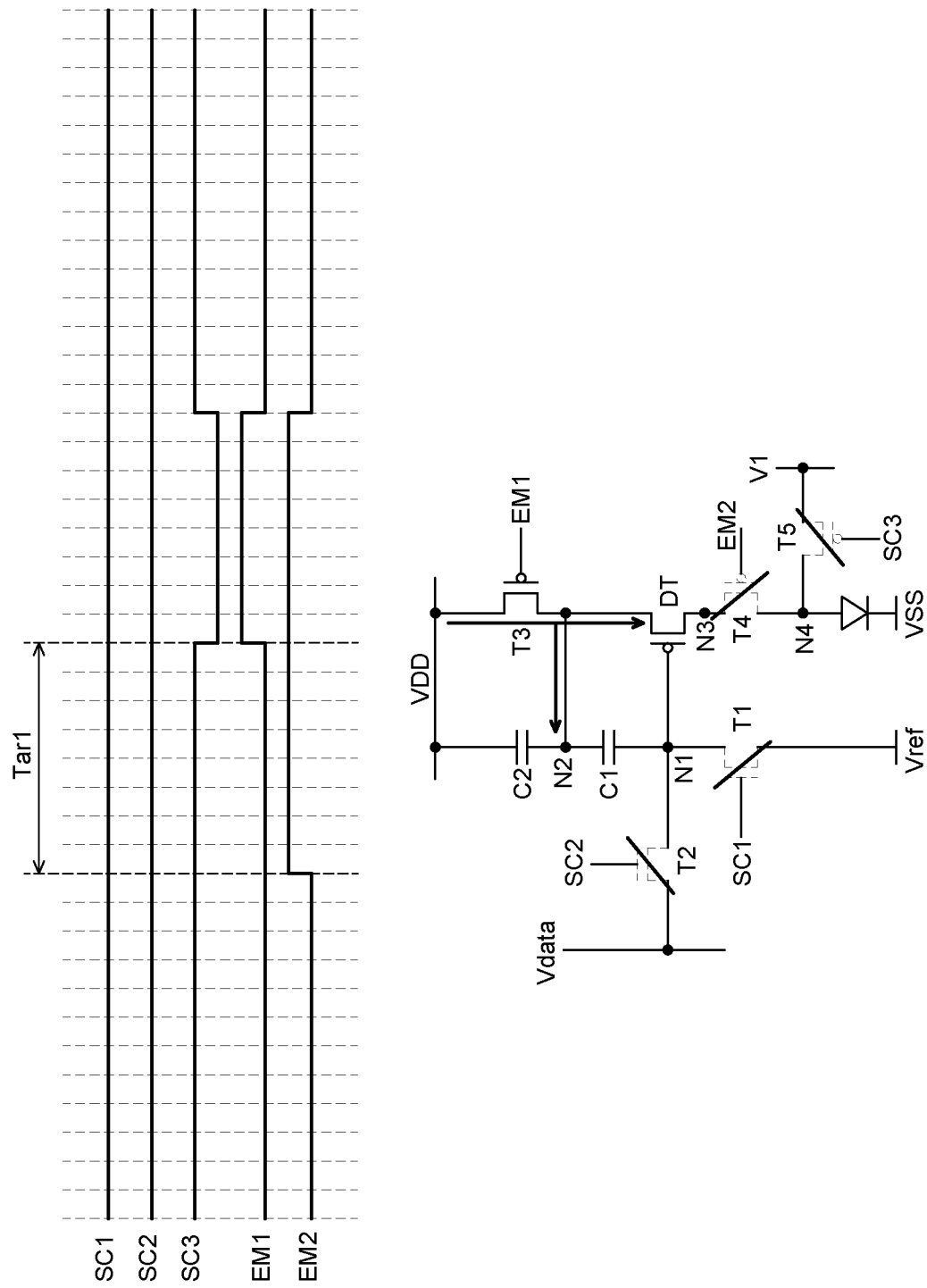
FIGS. 4A to 4C are waveforms illustrating driving steps of a pixel circuit during a hold period in an organic light emitting display apparatus according to an exemplary embodiment of the present disclosure.
Figure 4B:
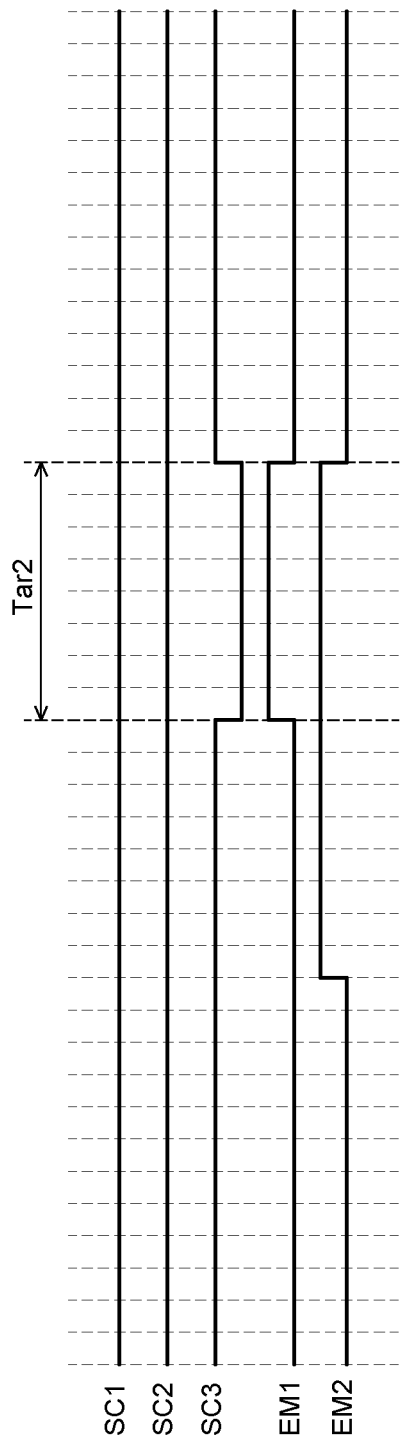
Figure 4B:
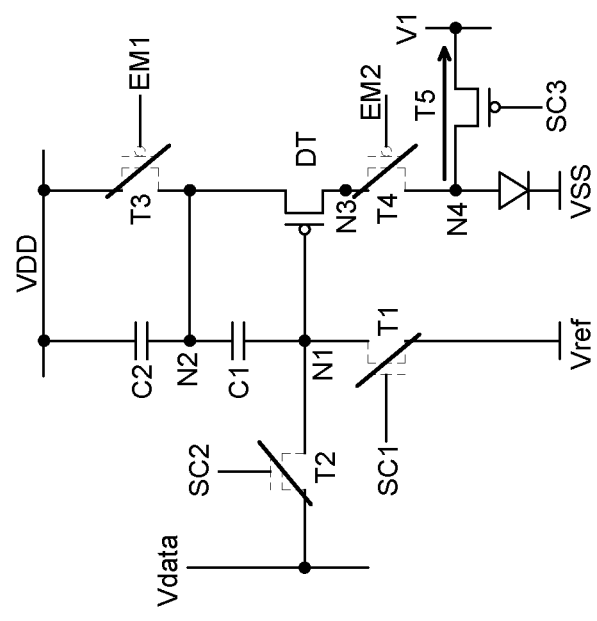
Figure 4C:
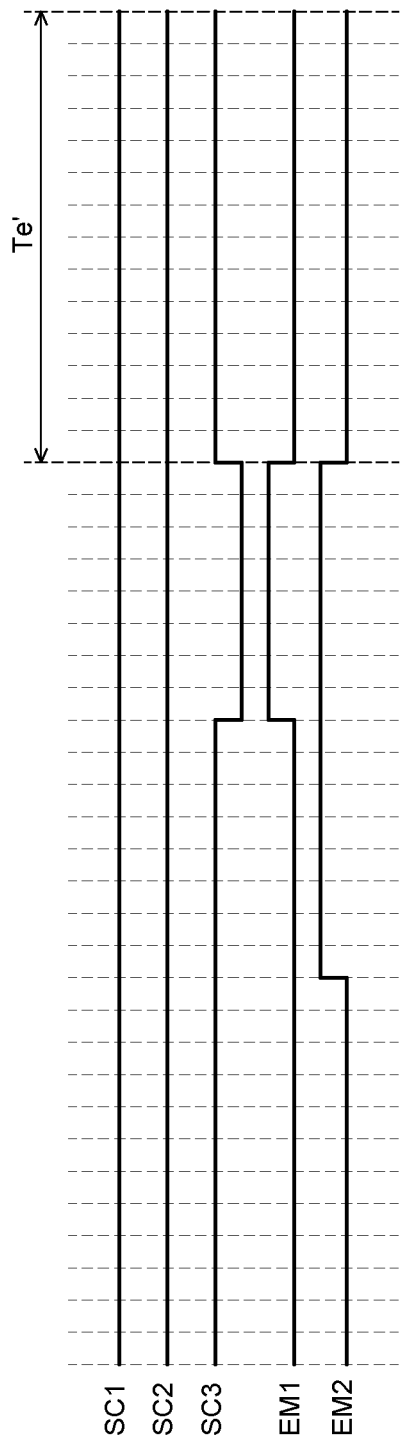
Figure 4C:
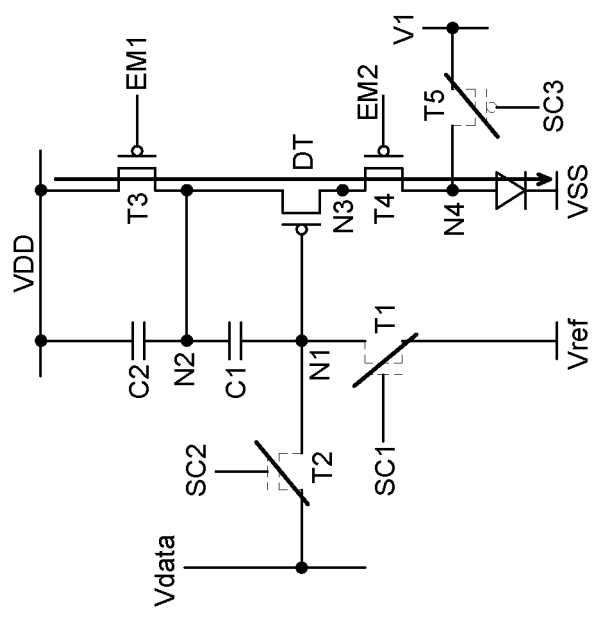

FIGS. 4A to 4C are waveforms illustrating driving steps of a pixel circuit during a hold period in an organic light emitting display apparatus according to an exemplary embodiment of the present disclosure.

Each of the plurality of pixels SP may be driven by a combination of a refresh period and a hold period in one frame. In the refresh period, a new data voltage Vdata is charged to apply the new data voltage Vdata to the gate electrode of the driving transistor DT, and in the hold period, a data voltage Vdata of the refresh period is held as it is to be used. In the meantime, in the hold period, a process of applying the new data voltage Vdata to the gate electrode of the driving transistor DT is omitted so that the hold period is also referred to as a skip period.

Each of the plurality of pixels SP may initialize a voltage which is charged in the pixel circuit or remains during the refresh period. Specifically, in the refresh period, the influence of the data voltage Vdata and the driving voltage VDD stored in a previous frame is removed to display an image corresponding to a new data voltage Vdata.

Each of the plurality of pixels SP supplies a driving current Id corresponding to the data voltage Vdata to the organic light emitting diode OLED to display images OLED, during the hold period.

First, the driving of the pixel circuit and the organic light emitting diode OLED of the refresh period will be described with reference to FIGS. 3A to 3D. The driving of the pixel circuit of the refresh period may be divided into an initialization period Ti, a sampling period Ts, a programming period Tp, and an emission period Te.

Figure 3A:
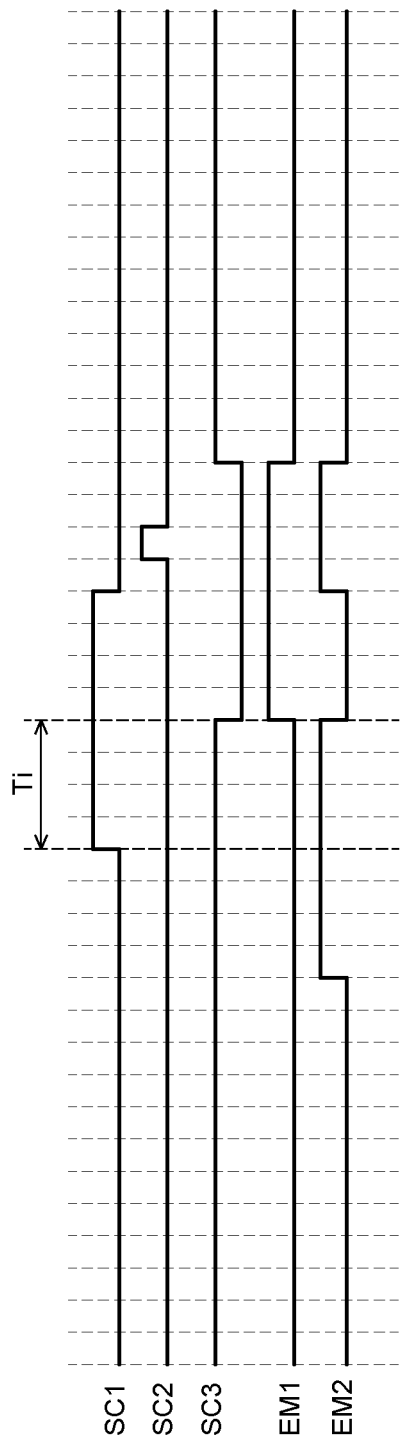
FIGS. 3A to 3D are waveforms illustrating driving steps of a pixel circuit during a refresh period in an organic light emitting display apparatus according to an exemplary embodiment of the present disclosure.
Figure 3A:
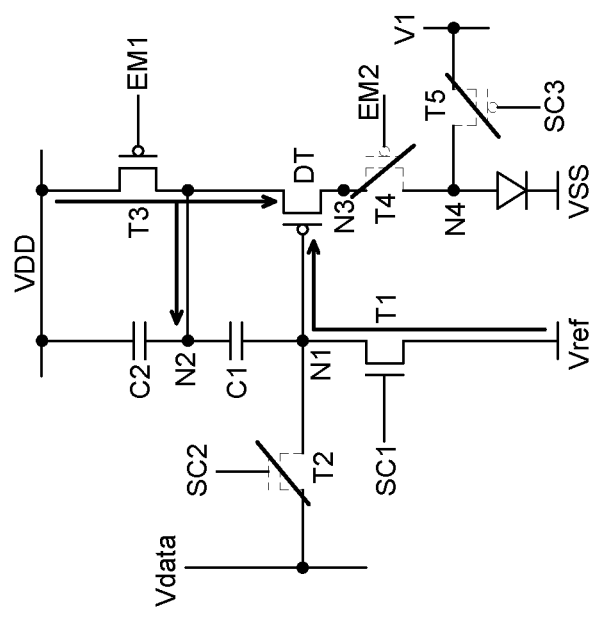

FIG. 3A is a waveform illustrating an initialization period Ti of a pixel circuit driving step of the refresh period according to one embodiment. The initialization period Ti is controlled by the first scan signal SC1 and the first emission signal EM1. The first scan signal SC1 is an on-level pulse during the initialization period Ti. While the first scan signal SC1 is an on-level pulse in the initialization period Ti, the second scan signal SC2 and the third scan signal SC3 are off-level pulses. Further, the first emission signal EM1 is an on-level pulse, and the second emission signal EM2 is an off-level pulse.

At this time, in order to suppress the emission of the organic light emitting diode OLED by mixing the second emission signal EM2 and the first emission signal EM1 in the initialization period Ti, the second emission signal EM2 is switched to an off-level pulse state before the initialization period Ti.

During the initialization period Ti, the first transistor T1, the third transistor T3, and the driving transistor DT are turned, on and the second transistor T2, the fourth transistor T4, and the fifth transistor T5 are turned off.

During the initialization period Ti, the first transistor T1 is turned on to supply the reference voltage Vref to the gate electrode of the driving transistor DT to turn on the driving transistor DT. The source electrode of the driving transistor DT is connected to a wiring line to which the high potential voltage VDD is applied to be supplied with the high potential voltage VDD.

Accordingly, a stress voltage to be applied to the driving transistor DT is determined in accordance with the reference voltage Vref applied to the gate electrode of the driving transistor DT. During the initialization period Ti, the first node N1 maintains the reference voltage Vref state to turn on the driving transistor DT and apply a predetermined stress to the driving transistor DT. The reference voltage Vref which is supplied to the first node N1 via the first transistor T1 applies a stress to the driving transistor DT for a predetermined time to suppress the degradation of the luminance caused by the hysteresis of the driving transistor DT.

At this time, the reference voltage Vref is a fixed voltage which turns on the driving transistor DT and initializes the gate electrode of the driving transistor DT. The lower the reference voltage Vref, the larger the range of the threshold voltage Vth of the driving transistor DT to be sensed. During the initialization period Ti, the gate-source voltage Vgs of the driving transistor DT is a difference between the reference voltage Vref and the high potential voltage VDD.

The pixel circuit according to the exemplary embodiment of the present disclosure operates the initialization period Ti to have a driving time of at least one horizontal scanning time (1H time) so that a time to apply the reference voltage Vref to the driving transistor DT to be initialized is sufficiently ensured. By doing this, the reliability of the pixel circuit may be improved.

In this regards, one horizontal scanning time (1H time) means the time when the second scan SC2 is on-level pulse.

Figure 3B:
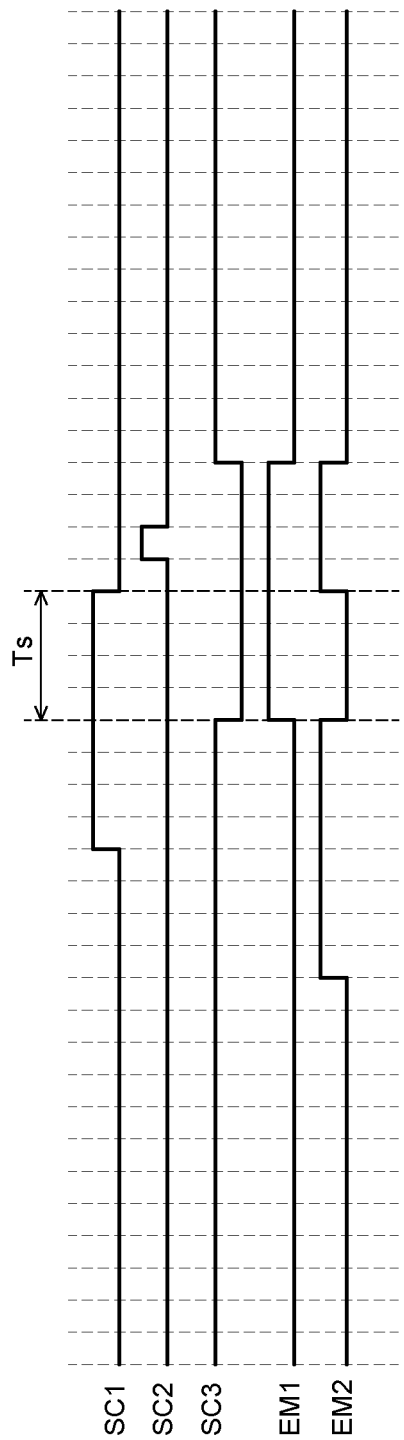
Figure 3B:
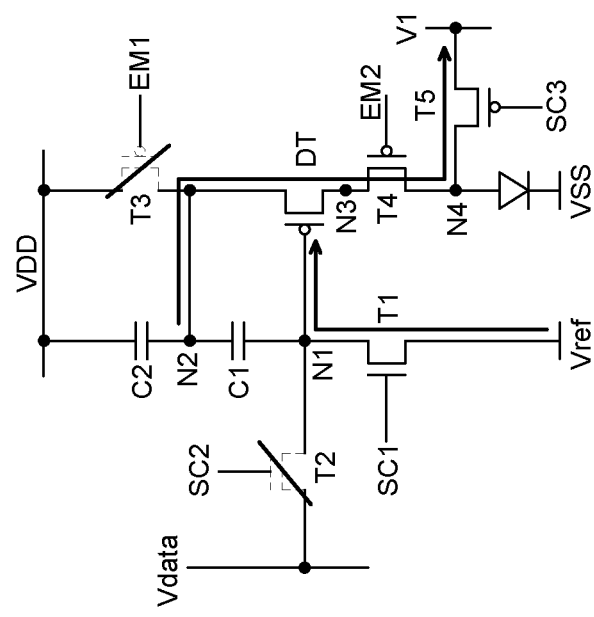

FIG. 3B is a waveform illustrating a sampling period Ts of a pixel circuit driving step of the refresh period according to one embodiment. The sampling period Ts is at least two horizontal scanning times (2H time) and is controlled by the first scan signal SC1, the third scan signal SC3, and the second emission signal EM2 and simultaneously the organic light emitting diode OLED is controlled by the third scan signal SC3 so as not to emit light.

While the first scan signal SC1 and the third scan signal SC3 are on-level pulses in the sampling period Ts, the second scan signal SC2 is an off-level pulse. Further, the first emission signal EM1 is an off-level pulse and the second emission signal EM2 is an on-level pulse.

During the sampling period Ts, the first transistor T1, the fourth transistor T4, the fifth transistor T5, and the driving transistor DT are turned on and the second transistor T2 and the third transistor T3 are turned off.

During the sampling period Ts, together with the driving transistor DT, the fourth transistor T4 which is an emission transistor is turned on by the second emission signal EM2, and the fifth transistor T5 may be turned on by the third scan signal SC3. At this time, the first bias voltage V1 applied to one end of the fifth transistor T5 has a lower voltage level than the low potential voltage VSS or a voltage level of the fourth node N4 so that the organic light emitting diode OLED is not turned on.

A voltage of the first node N1 which is the gate electrode of the driving transistor DT turned on during the sampling period Ts maintains a reference voltage Vref applied during the initialization period Ti. At this time, one end of the first capacitor C1 is connected to the first node N1 which is the gate electrode of the driving transistor DT and the second node N2 is connected to the source electrode of the driving transistor DT. Accordingly, the voltage stored in the first capacitor C1 may be a voltage to be applied to the source electrode of the driving transistor DT.

The first capacitor C1 stores the high potential voltage VDD in the second node N2 in the initialization period Ti and reduces the voltage stored in the second node N2 to a value Vref+|Vth| obtained by adding the threshold voltage Vth and the reference voltage Vref to sense the threshold voltage Vth in the sampling period Ts. Further, the first capacitor C1 may sense the threshold voltage Vth with a gate-source voltage Vgs which is a voltage difference of the gate electrode and the source electrode of the driving transistor DT. In other words, in order to sense the threshold voltage Vth of the driving transistor DT, the high potential voltage VDD is desirably set to have a voltage level which is always higher than a sum of the threshold voltage Vth and the reference voltage Vref.

The first capacitor C1 and the second capacitor C2 share the second node N2 and one end of the second capacitor C2 is connected to the high potential voltage line of the high potential voltage VDD. Therefore, even though the first emission signal EM1 is applied at an off-level in the sampling period Ts, the second node N2 may be held so as not to be floated.

The pixel circuit according to the exemplary embodiment of the present disclosure operates the sampling period Ts to have a driving time of at least two horizontal scanning times so that a time to sense the threshold voltage Vth of the driving transistor DT is sufficiently ensured to improve the reliability of the pixel circuit.

Figure 3C:
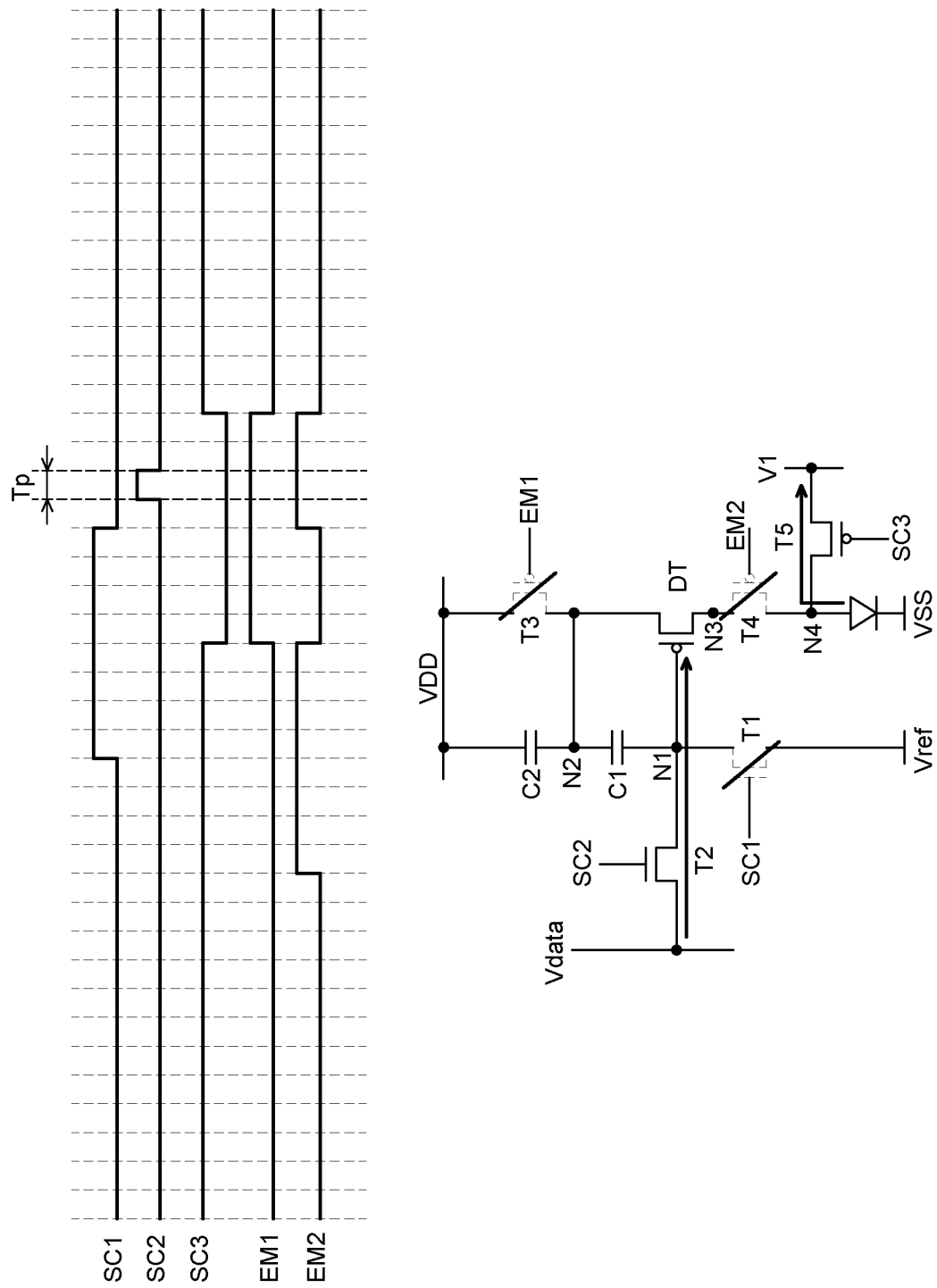

FIG. 3C is a waveform illustrating a programming period Tp of a pixel circuit driving step of the refresh period according to one embodiment. The programming period Tp is controlled by the second scan signal SC2 and the third scan signal SC3.

While the second scan signal SC2 and the third scan signal SC3 are on-level pulses in the programming period Tp, the first scan signal SC1 is an off-level pulse. Further, the first emission signal EM1 and the second emission signal EM2 are off-level pulses.

During the programming period Tp, the second transistor T2, the fifth transistor T5, and the driving transistor DT are turned on, and the first transistor T1, the third transistor T3, and the fourth transistor T4 are turned off.

The second transistor T2 is turned on to apply a data voltage Vdata to the first node N1. The first node N1 is one electrode of the first capacitor C1 so that the voltage stored in the first capacitor C1 may be increased to a value Vref+|Vth|+Vdata−Vref)(C1/C1+C2) obtained by adding a variation of the data voltage Vdata to the sum of the reference voltage Vref and the threshold voltage Vth stored during the sampling period Ts.

Further, the first bias voltage V1 applied to one end of the fifth transistor T5 has a lower voltage level than a voltage level of the low potential voltage VSS or the fourth node N4 so that the organic light emitting diode OLED is not turned on, but the anode electrode may be reset.

The pixel circuit according to the exemplary embodiment of the present disclosure operates with one horizontal scanning time (1H time) during the programming period Tp.

Figure 3D:
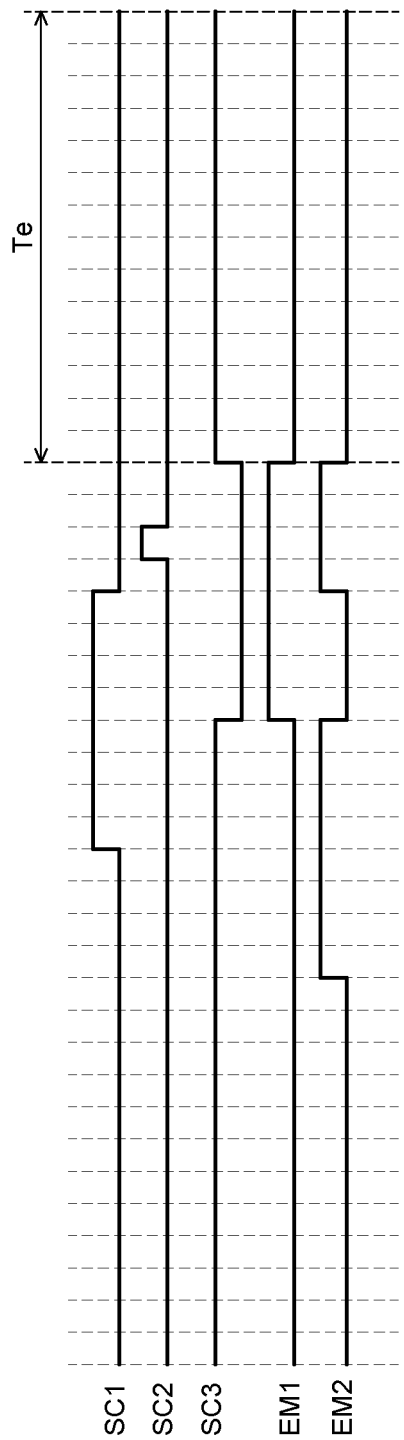
Figure 3D:
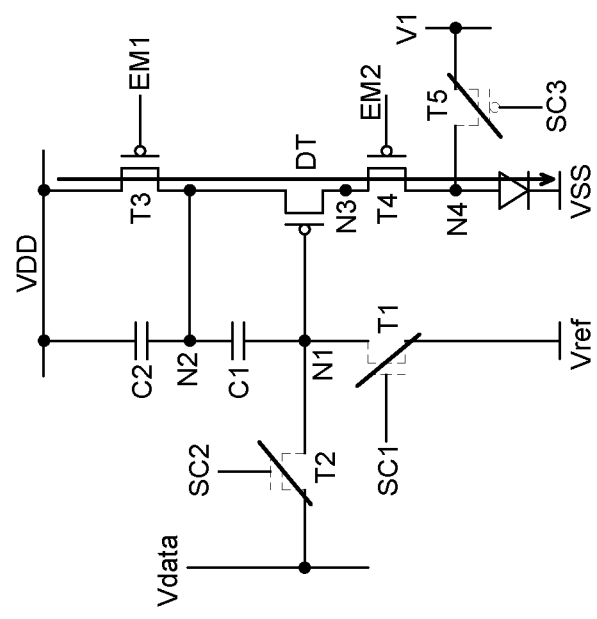

FIG. 3D is a waveform illustrating an emission period Te of a pixel circuit driving step of the refresh period according to one embodiment. The emission period Te occupies most (e.g., the majority) of one frame period and is controlled by the first emission signal EM1 and the second emission signal EM2. The first emission signal EM1 and the second emission signal EM2 are on-level pulses during the emission period Te. During the emission period Te, all the first to third scan signals SC1, SC2, and SC3 are off-level pulses.

During the emission period Te, the third transistor T3, the fourth transistor T4, and the driving transistor DT are turned on, and the first transistor T1, the second transistor T2, and the fifth transistor T5 are turned off.

During the emission period Te, the second node N2 connected to the source electrode of the driving transistor DT is supplied with the high potential voltage VDD. Accordingly, the first node N1 has a value Vdata+|VDD−Vref−|Vth|−(Vdata−Vref)(C1/C1+C2)| obtained by adding the data voltage Vdata to a difference of the voltage applied to the second node N2 during the programming period Tp and the high potential voltage VDD, by the coupling phenomenon of the first capacitor C1 connected to the first node N1 and the second node N2.

Further, during the emission period Te, the driving transistor DT is turned on by the voltage of the first node N1 to supply the driving current to the anode of the organic light emitting diode OLED. In this case, the driving current $I_{oled}$ may be expressed by Equation 1.

[Equation 1]
$$I_{oled} = K(Vsg - Vth)^2 = K\{VDD - \left(Vdata + VDD - Vref - |Vth| - (Vdata - Vref)\left(\frac{C2}{C1} + C2\right) - Vth\right)^2 = \left\{(Vref - Vdata)\left(\frac{C2}{C1} + C2\right)\right\}^2$$

In this case, K is a constant to which a length of a channel, a width of the channel, a parasitic capacitance between the gate and the active layer, and a mobility which are characteristics of the driving transistor DT are reflected. Referring to Equation 1, the threshold voltage Vth of the driving transistor DT and the high potential voltage VDD are eliminated from the driving current $I_{oled}$ so that the driving current $I_{oled}$ does not depend on the threshold voltage Vth of the driving transistor DT and is not affected by the change of the threshold voltage Vth. Further, the driving current $I_{oled}$ is not affected by the high potential voltage VDD so that the variability of the driving current by voltage drop of the high potential voltage line is lowered. Accordingly, the luminance uniformity in the display panel 100 is excellent and specifically, it may be advantageous to drive a large size organic light emitting display apparatus.

The pixel circuit according to the exemplary embodiment of the present disclosure may reduce a leakage current of a gate electrode of the driving transistor DT which may occur during a high speed operation and suppress the degradation of the luminance which may occur during a low speed operation. By doing this, the power consumption may be reduced while improving the image quality.

Next, the driving of the pixel circuit and the organic light emitting diode OLED of the hold period will be described with reference to FIGS. 4A to 4C. The hold period may include at least one anode reset period and emission period.

As described above, in the refresh period, a new data voltage Vdata is charged to apply a new data voltage Vdata to the gate electrode of the driving transistor DT, but in the hold period, the data voltage Vdata of the refresh period is held as it is to be used. Accordingly, the hold period does not require the initialization period and the sampling period, unlike the refresh period.

FIG. 4A is a waveform illustrating a first anode reset period Tar1 of a pixel circuit driving step of the hold period (e.g., the majority). The first anode reset period Tar1 is controlled by the first emission signal EM1. During the first anode reset period Tar1, the first to third scan signals SC1, SC2, and SC3 are off-level pulses. While the first emission signal EM1 is an on-level pulse during the first anode reset period Tar1, the second emission signal EM2 is an off-level pulse.

During the first anode reset period Tar1, the third transistor T3 and the driving transistor DT are turned on and the first transistor T1, the second transistor T2, the fourth transistor T4, and the fifth transistor T5 are turned off.

During the first anode reset period Tar1, the second emission signal EM2 is an off-level pulse to turn off the fourth transistor T4 which is turned on in a previous emission period Te. Accordingly, the organic light emitting diode OLED may not emit light.

FIG. 4B is a waveform illustrating a second anode reset period Tar2 of a pixel circuit driving step of the hold period according to one embodiment. The second anode reset period Tar2 is controlled by the third scan signal SC3. During the second anode reset period Tar2, the first scan signal SC1 and the second scan signal SC2 are off-level pulses. Further, the first emission signal EM1 and the second emission signal EM2 are also off-level pulses.

During the second anode reset period Tar2, the fifth transistor T5 and the driving transistor DT are turned on and the first to fourth transistors T1, T2, T3, and T4 are turned off.

The first emission signal EM1 and the second emission signal EM2 are off-level pulses during the second anode reset period Tar2 so that the organic light emitting diode OLED may not emit light. At this time, the first bias voltage V1 applied to one end of the fifth transistor T5 has a lower voltage level than a voltage level of the low potential voltage VSS or the fourth node N4 so that the organic light emitting diode OLED is not turned on, but the anode electrode may be reset.

FIG. 4C is a waveform illustrating an emission period Te' of a pixel circuit driving step of the hold period according to one embodiment. The emission period Te' is controlled by the first emission signal EM1 and the second emission signal EM2. During the emission period Te', all the first to third scan signals SC1, SC2, and SC3 are off-level pulses and the first emission signal EM1 and the second emission signal EM2 are on-level pulses.

The operation in the emission period Te' of the hold period may be the same as the operation of the emission period Te of the refresh period so that a redundant description will be omitted.

The pixel circuit according to the exemplary embodiment of the present disclosure separately drives the sampling period Ts and the programming period Tp so that the sampling period Ts may operate to have an operation time of at least two horizontal scanning times (2H times). Accordingly, a time to sense the threshold voltage Vth of the driving transistor DT is sufficiently ensured to improve the reliability of the pixel circuit.

Figure 5:
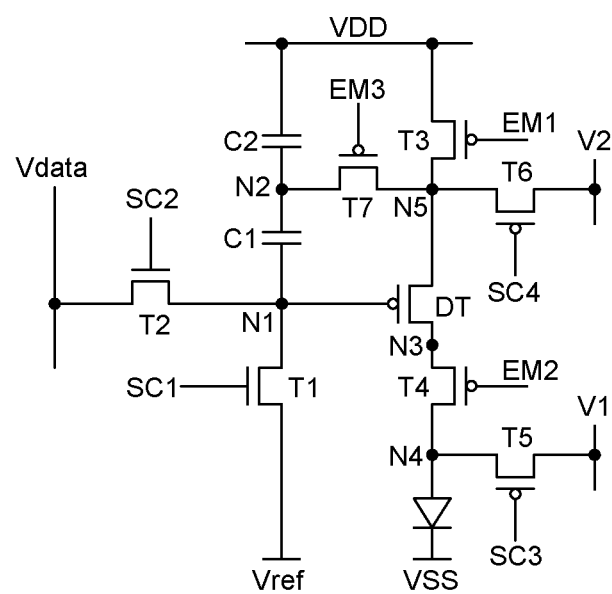
FIG. 5 is a circuit diagram of a pixel circuit of an organic light emitting display apparatus according to another exemplary embodiment of the present disclosure.

FIG. 5 is a circuit diagram of a pixel circuit of an organic light emitting display apparatus according to another exemplary embodiment of the present disclosure.

Referring to FIG. 5, according to an exemplary embodiment, an on-bias stress period Tobs further operates in the pixel circuit driving step of FIG. 2. Hysteresis may be caused during the driving of the driving transistor DT. When an image displayed on the display panel 100 is switched from one gray scale level to another gray scale level, the threshold voltage Vth is shifted thereby causing the reduction in the luminance. For example, a threshold voltage Vth of the driving transistor DT for a driving current Id of a low gray scale level may be offset from a threshold voltage Vth of the driving transistor DT for a driving current Id of a high gray scale level.

The threshold voltage Vth which is sampled without performing the on-bias stress period Tobs may be shifted from the threshold voltage Vth for a target driving current Id in accordance with the low gray scale level. Further, the threshold voltage Vth which is sampled by performing the on-bias stress period Tobs better matches the target driving current Id in accordance with the data voltage Vdata. Accordingly, when the on-bias stress period Tobs is performed before sampling the threshold voltage Vth of the driving transistor DT, the hysteresis may be reduced. Therefore, the on-bias stress period Tobs may be defined as an operation of directly applying the bias voltage to the driving transistor DT in an operation period except for the emission period Te.

Referring to FIG. 5, for the operation of the on-bias stress period Tobs, the pixel circuit may further include a sixth transistor T6 and a seventh transistor T7. The pixel circuit may be further applied with a power voltage including a second bias voltage V2 and a driving signal including a fourth scan signal SC4 and a third emission signal EM3.

The driving transistor DT includes a gate electrode connected to the first node N1, a drain electrode connected to the third node N3, and a source electrode connected to a fifth node N5.

The sixth transistor T6 is turned on by the fourth scan signal SC4 to supply a second bias voltage V2 to the fifth node N5. The sixth transistor T6 is connected to a second bias voltage line to which a second bias voltage V2 is supplied. The sixth transistor T6 may also be referred to as an on-bias stress transistor. Generally, the second bias voltage V2 is higher than the threshold voltage Vth of the driving transistor DT.

The seventh transistor T7 is turned on by the third emission signal E3 to electrically connect the second node N2 between the first capacitor C1 and the second capacitor C2 to the fifth node N5. When the first capacitor C1 serving as a storage capacitor and the second capacitor C2 which suppresses the floating of the second node N2 are connected in series, a capacitance may be reduced. Accordingly, the seventh transistor T7 is turned on in the operation periods other than the on-bias stress period Tobs to suppress the serial connection of the first capacitor C1 and the second capacitor C2, thereby improving the reliability of the pixel circuit.

The sixth transistor T6 and the seventh transistor T7 may be PMOS transistors which are advantageous for operation reliability and current supplying performance.

FIGS. 6A to 6E are waveforms illustrating driving steps of a pixel circuit during a refresh period in an organic light emitting display apparatus according to another exemplary embodiment of the present disclosure.

Figure 7A:
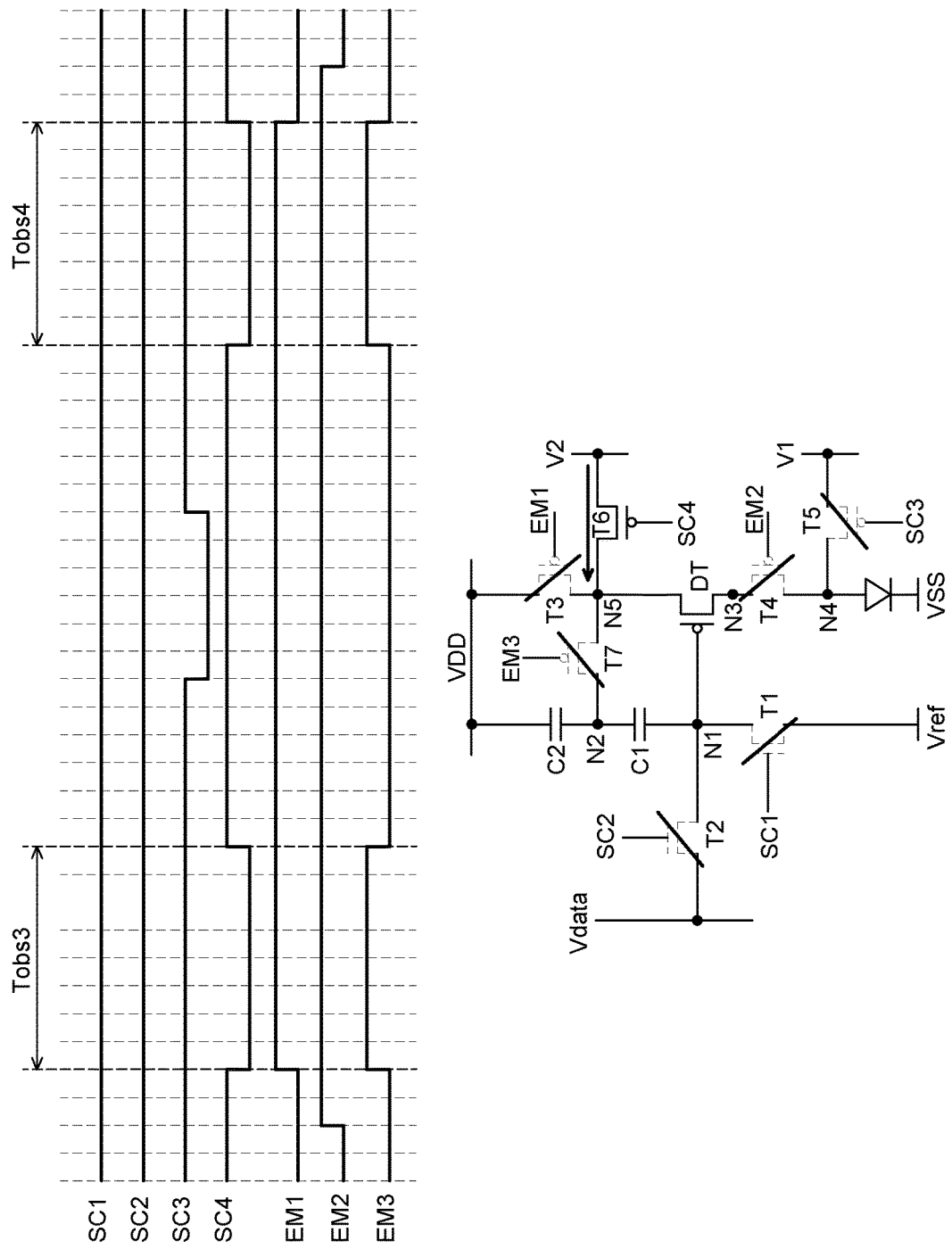
FIGS. 7A to 7C are waveforms illustrating driving steps of a pixel circuit during a hold period in an organic light emitting display apparatus according to another exemplary embodiment of the present disclosure.
Figure 7B:
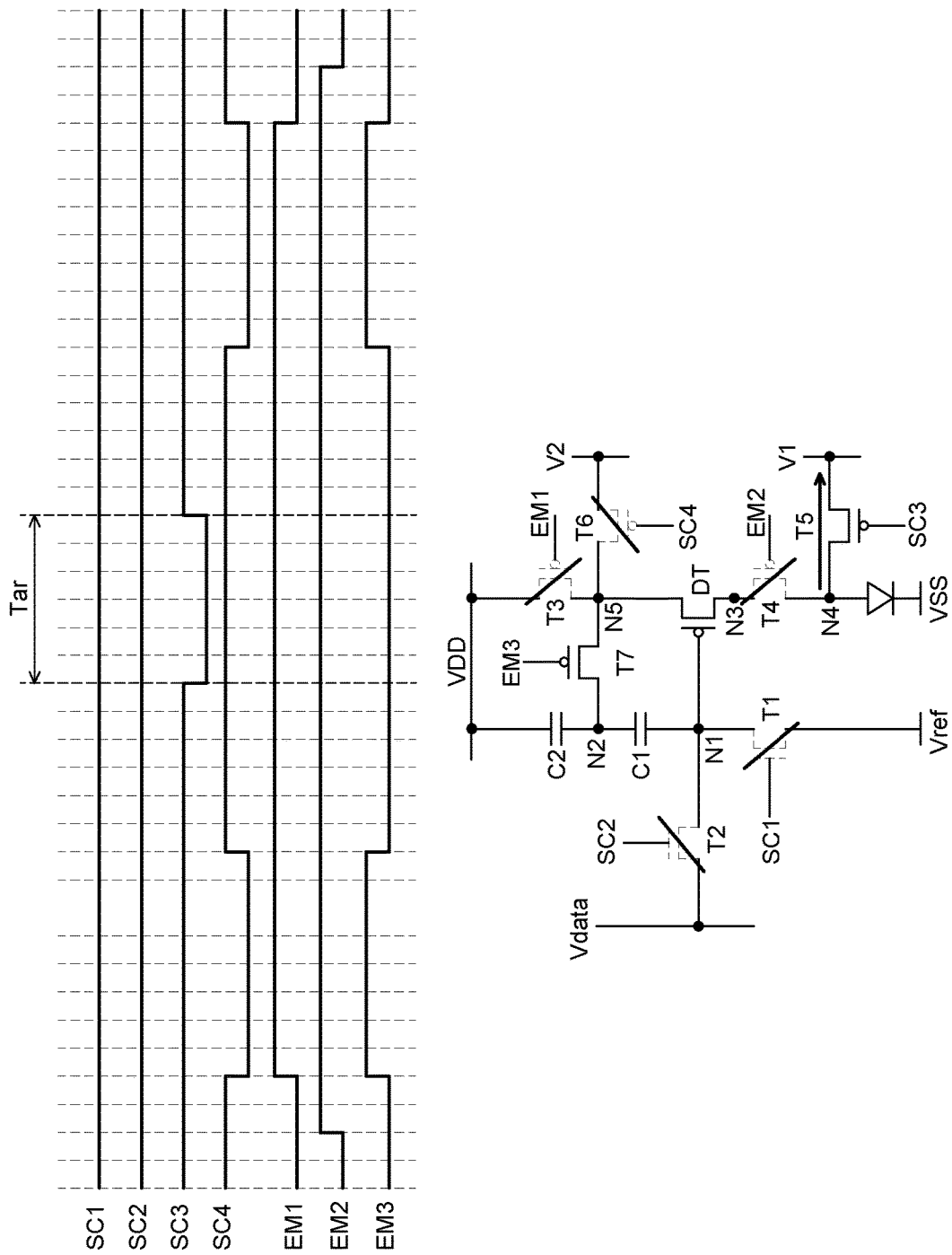
Figure 7C:
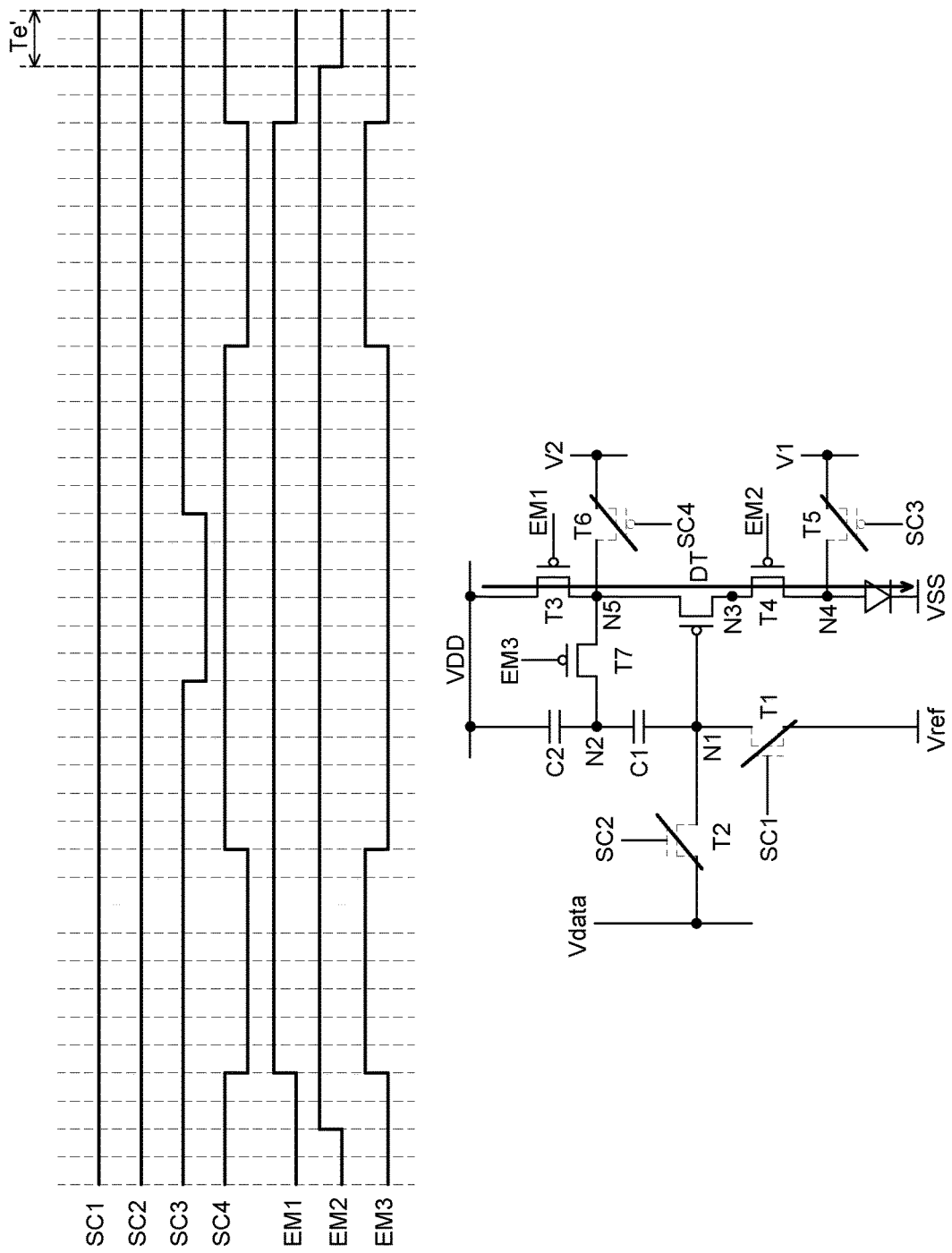

FIGS. 7A to 7C are waveforms illustrating driving steps of a pixel circuit during a hold period in an organic light emitting display apparatus according to another exemplary embodiment of the present disclosure.

First, the driving of the pixel circuit and the organic light emitting diode OLED of the refresh period will be described with reference to FIGS. 6A to 6E. The driving of the pixel circuit of the refresh period may be divided into an on-bias stress period Tobs, an initialization period Ti, a sampling period Ts, a programming period Tp, and an emission period Te.

Figure 6A:
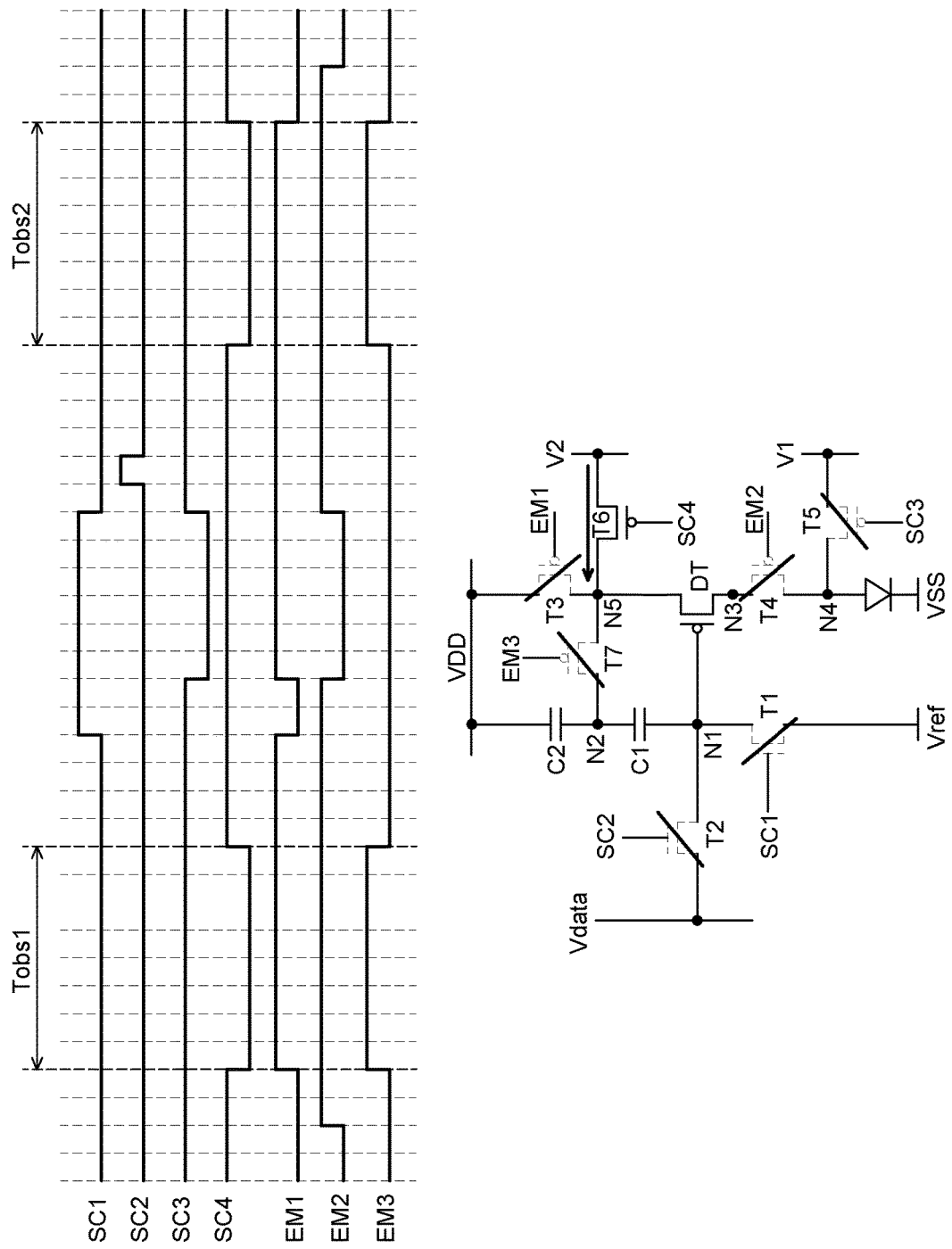
FIGS. 6A to 6E are waveforms illustrating driving steps of a pixel circuit during a refresh period in an organic light emitting display apparatus according to another exemplary embodiment of the present disclosure.
Figure 6B:
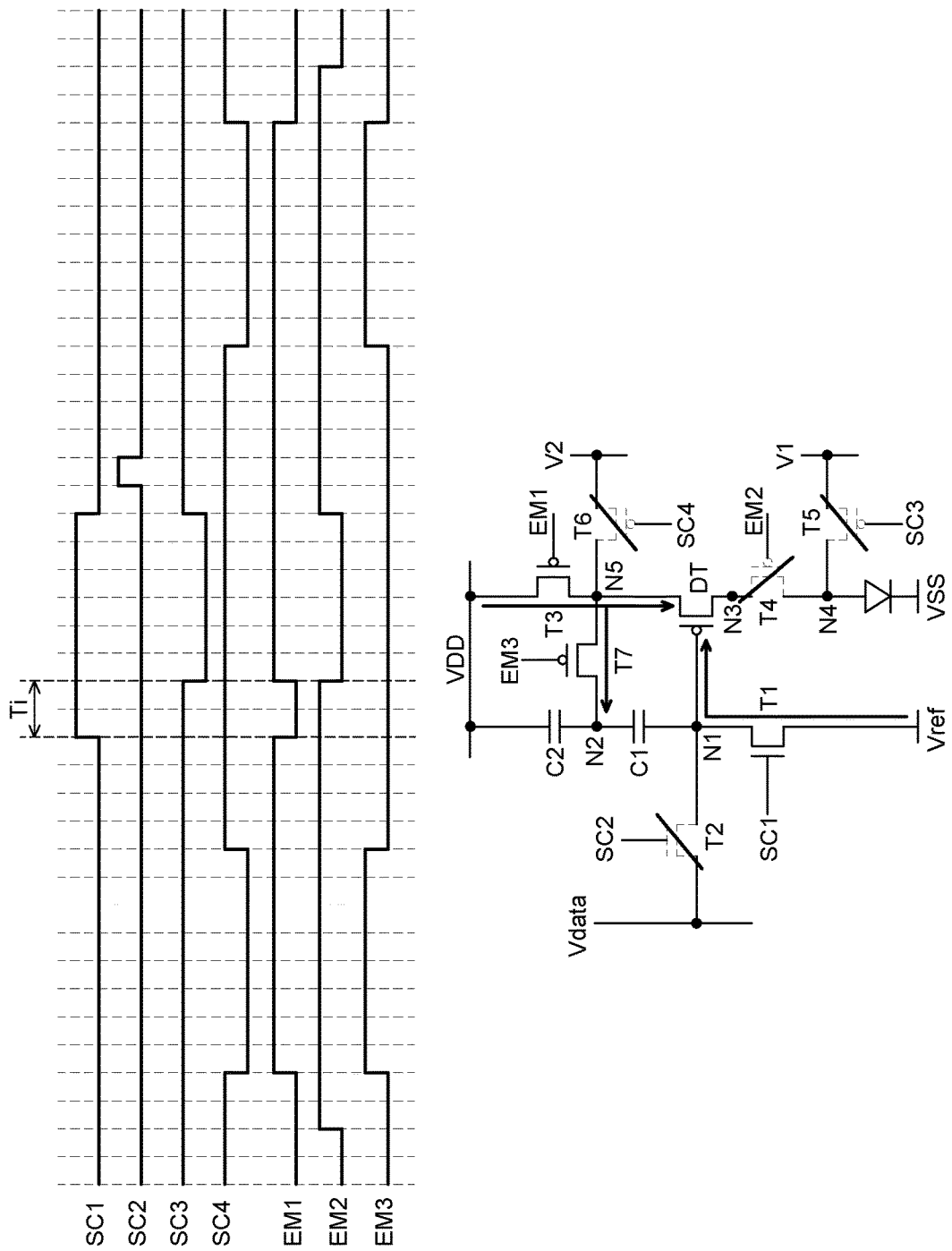
Figure 6C:
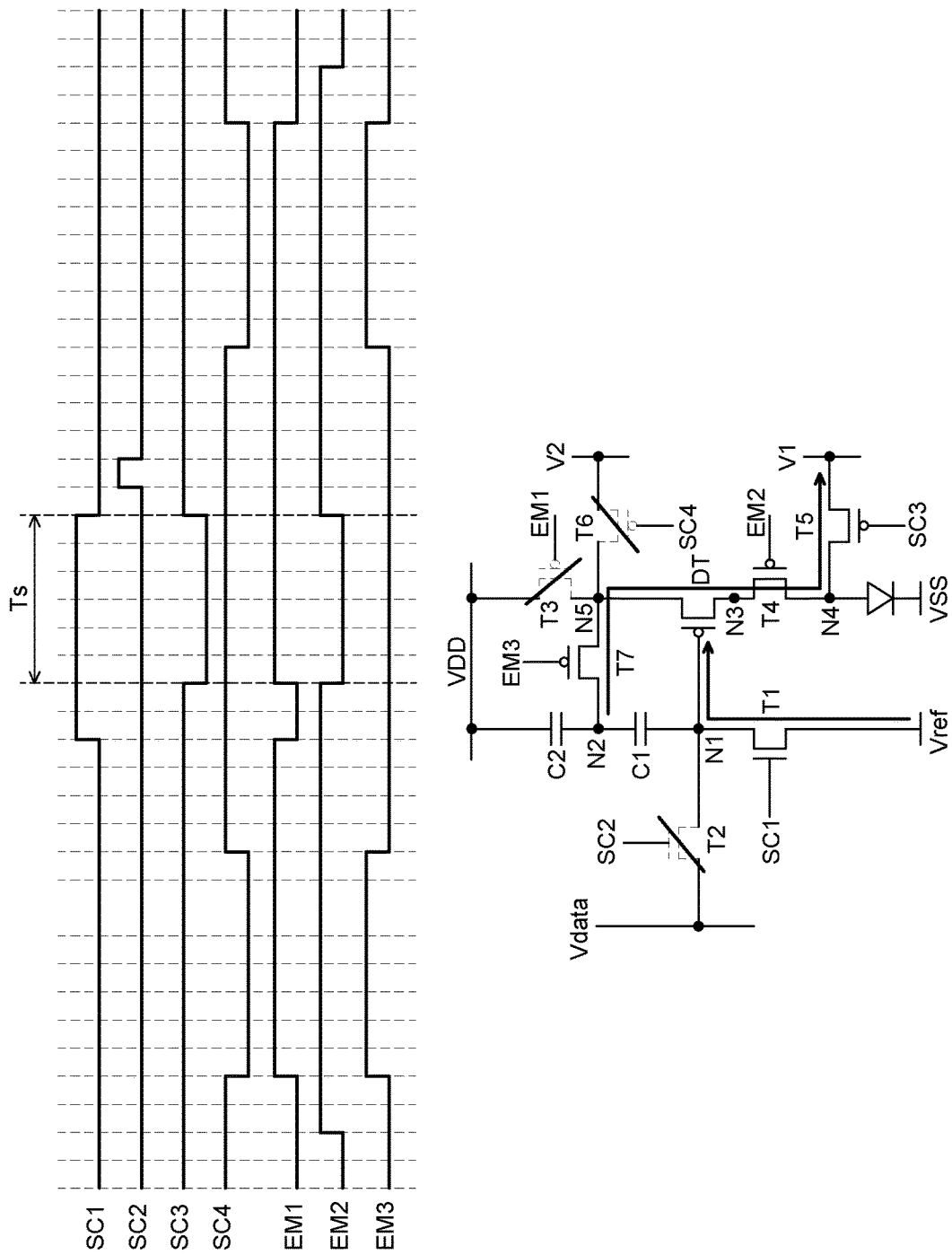
Figure 6D:
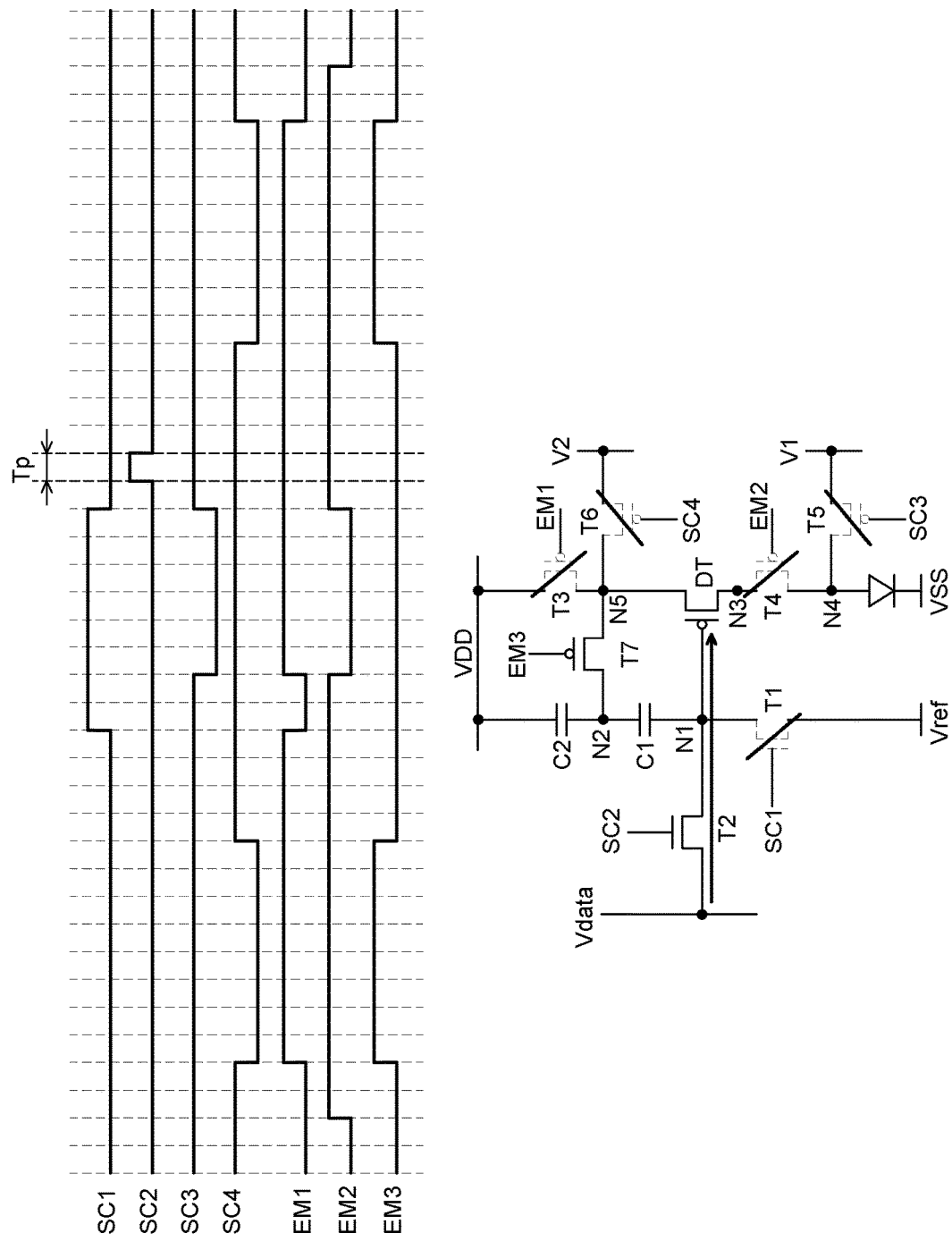
Figure 6E:
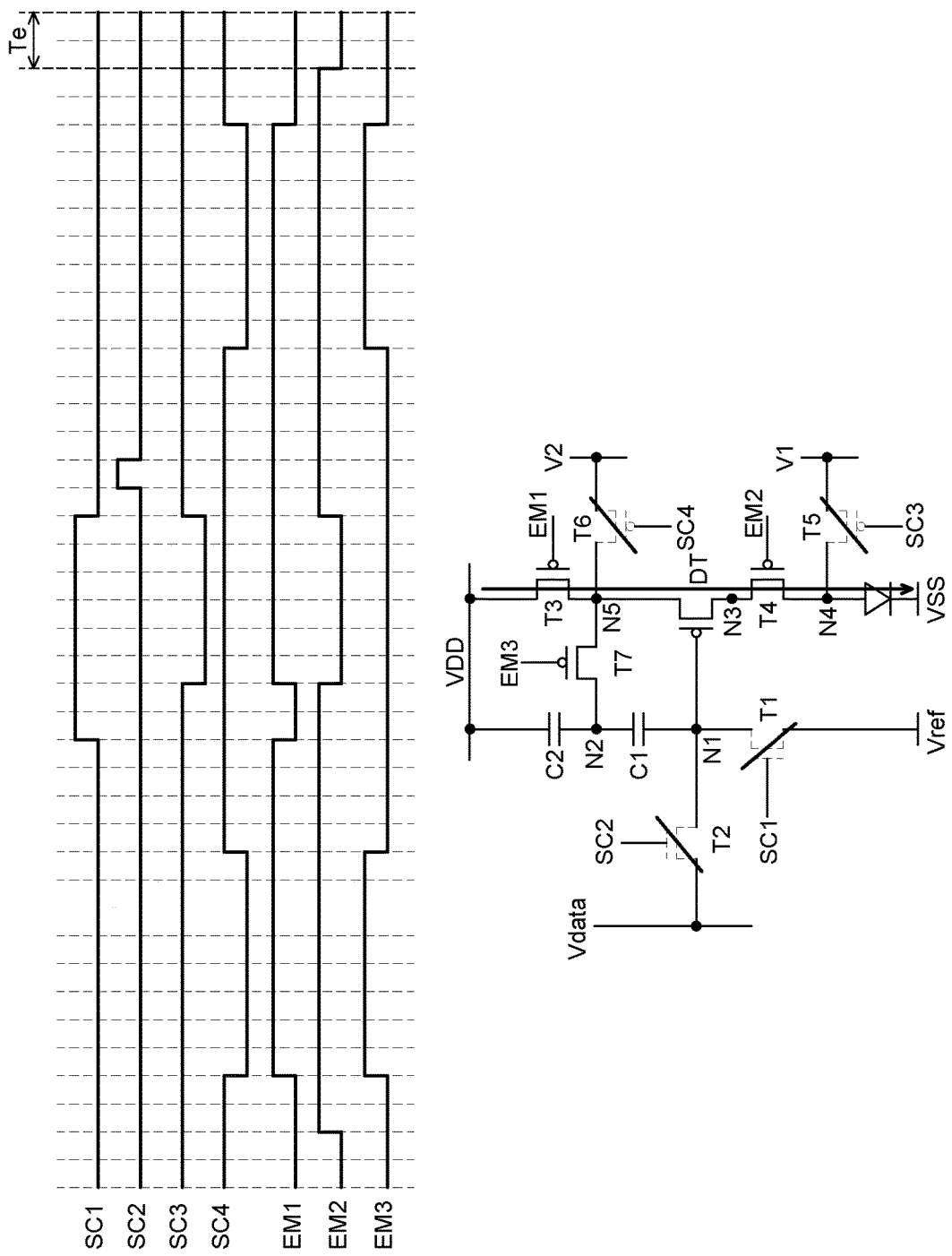

FIG. 6A is a waveform illustrating an on-bias stress period Tobs of a pixel circuit driving step of the refresh period according to one embodiment. The on-bias stress period Tobs is controlled by the fourth scan signal SC4. The fourth scan signal SC4 is an on-level pulse during the on-bias stress period Tobs. During the on-bias stress period Tobs, while the fourth scan signal SC4 is an on-level pulse, the first to third scan signals SC1, SC2, and SC3 are off-level pulses. Further, the first to third emission signals EM1, EM2 and EM3 are off-level pulses.

During the on-bias stress period Tobs, the sixth transistor T6 and the driving transistor DT are turned on, and a first transistor T1, a second transistor T2, a third transistor T3, a fourth transistor T4, a fifth transistor T5 and the seventh transistor T7 are turned off.

During the on-bias stress period Tobs, the sixth transistor T6 is turned on to supply the second bias voltage V2 to the source electrode of the driving transistor DT. The gate electrode of the driving transistor DT is applied with a voltage of a previous frame stored in the first capacitor C1 to turn on the driving transistor DT.

Therefore, the bias stress applied to the gate electrode of the driving transistor DT is relieved by means of the sixth transistor T6 during the on-bias stress period Tobs to suppress the degradation of the luminance caused by the hysteresis of the driving transistor DT.

In order to ensure the effectiveness of the on-bias stress operation, the fourth scan signal SC4 may be pulsed to an on-level a plurality of times to perform additional on-bias stress operations. Therefore, the on-bias stress period Tobs may include a first on-bias stress period Tobs1 and a second on-bias stress period Tobs2 during an operation period except for the emission period Te.

During the on-bias stress period Tobs, the fourth scan signal SC4 which controls the sixth transistor T6 and the third emission signal EM3 which controls the seventh transistor T7 are reverse phases. Therefore, the fourth scan signal and the third emission signal are combined as one signal and an additional circuit such as an inverter is configured to supply the signal. In this case, the configuration of the gate driver 300 is simplified to reduce a bezel area of the display panel 100.

Further, since a period in which the third emission signal EM3 operates as an off-level pulse during the on-bias stress period Tobs is included in a period in which the first emission signal EM1 is an off-level pulse, the third emission signal EM3 which controls the seventh transistor T7 may be replaced with the first emission signal EM1. In this case, the configuration of the gate driver 300 is simplified to reduce a bezel area of the display panel 100.

FIGS. 6B to 6E are waveforms illustrating an initialization period Ti, a sampling period Ts, a programming period Tp, and an emission period Te of the pixel circuit driving step of the refresh period according to one embodiment.

In the initialization period Ti, the sampling period Ts, the programming period Tp, and the mission period Te, the sixth transistor T6 which is controlled by the fourth scan signal SC4 is turned off and the seventh transistor T7 which is controlled by the third emission signal EM3 is turned on. Accordingly, the operation of the pixel circuit may be the same as the operation of the pixel circuit driving step of the organic light emitting display apparatus according to the exemplary embodiment of the present disclosure so that a redundant description will be omitted.

Next, the driving of the pixel circuit and the organic light emitting diode OLED of the hold period will be described with reference to FIGS. 7A to 7C.

FIG. 7A is a waveform illustrating an on-bias stress period Tobs of a pixel circuit driving step of the hold period according to one embodiment. The pixel circuit may have an on-bias stress period Tobs also in the hold period as the same as the refresh period.

In order to perform effective on-bias stress operations, the third fourth signal SC4 is pulsed to an on-level a plurality of times so that the on-bias stress period may have a third on-bias stress period Tobs3 and a fourth on-bias stress period Tobs4 in an operation period except for the emission period Te.

FIG. 7B is a waveform illustrating an anode reset period Tar of a pixel circuit driving step of the hold period according to one embodiment. The anode reset period Tar is controlled by the third scan signal SC3. During the anode reset period Tar, the first scan signal SC1, the second scan signal SC2, and the fourth scan signal SC4 are off-level pulses. Further, the first emission signal EM1 and the second emission signal EM2 are also off-level pulses.

During the anode reset period Tar, the fifth transistor T5, the seventh transistor T7 and the driving transistor DT are turned on, and the first to fourth transistors T1, T2, T3, and T4 and the sixth transistor T6 are turned off.

The first emission signal EM1 and the second emission signal EM2 are off-level pulses during the anode reset period Tar so that the organic light emitting diode OLED may not emit light. At this time, the first bias voltage V1 applied to one end of the fifth transistor T5 has a lower voltage level than a voltage level of the low potential voltage VSS or the fourth node N4 so that the organic light emitting diode OLED is not turned on, but the anode electrode may be reset.

FIG. 7C is a waveform illustrating an emission period Te' of a pixel circuit driving step of the hold period according to one embodiment. The emission period Te' is controlled by the first emission signal EM1 and the second emission signal EM2. During the emission period Te', all the first to fourth scan signals SC1, SC2, SC3, and SC4 are off-level pulses and the first to third emission signals EM1, EM2, and EM3 are on-level pulses.

The operation in the emission period Te' of the hold period may be the same as the operation of the emission period Te of the refresh period so that a redundant description will be omitted.

The pixel circuit according to another exemplary embodiment of the present disclosure is separately driven in the sampling period Ts and the programming period Tp so that the sampling period Ts may operate to have an operation time of at least two horizontal scanning times (2H times). Accordingly, a time to sense the threshold voltage Vth of the driving transistor DT is sufficiently ensured to improve the reliability of the pixel circuit.

Further, the on-bias stress period Tobs is further performed before sampling the threshold voltage Vth so that the luminance degradation caused by the hysteresis of the driving transistor DT is suppressed to improve the image quality.

The exemplary embodiments of the present disclosure can also be described as follows:

According to an aspect of the present disclosure, an organic light emitting display apparatus includes a display panel provided with a plurality of pixels including an organic light emitting diode and a pixel circuit, wherein the pixel circuit includes a driving transistor, a first transistor, a second transistor, a third transistor, a fourth transistor, a fifth transistor, a first capacitor, a second capacitor, a first node which is a gate electrode of the driving transistor, a second node which is a source electrode of the driving transistor, a third node which is a drain electrode of the driving transistor, and a fourth node which is an anode electrode of the organic light emitting diode, the first transistor is configured to supply a reference voltage to the first node in accordance with a first scan signal, the second transistor is configured to control electrical connection between the first node and a data line in accordance with a second scan signal, the third transistor is configured to control electrical connection between the second node and a high potential voltage line in accordance with a first emission signal, the fourth transistor is configured to control electrical connection between the third node and the fourth node in accordance with a second emission signal, the fifth transistor is configured to supply a first bias voltage to the fourth node in accordance with a third scan signal, the first capacitor is disposed between the first node and the second node, and the second capacitor is disposed between the high potential voltage line and the second node.

Each of the first transistor and the second transistor may be an NMOS transistor.

Each of the first transistor and the second transistor may be oxide thin film transistors.

Each of the third transistor, the fourth transistor and the fifth transistor may be low-temperature polycrystalline silicon thin film transistors.

One frame may be divided into a refresh period in which a data voltage is written and a hold period in which the data voltage written in the refresh period is held.

The refresh period may include first to fourth driving periods.

During the first driving period, the first scan signal and the first emission signal may be on-level, and the second scan signal, the third scan signal, and the second emission signal may be off-level.

During the second driving period, the first scan signal, the third scan signal, and the second emission signal may be on-level, and the second scan signal and the first emission signal may be off-level.

During the third driving period, the second scan signal and the third scan signal may be on-level, and the first scan signal, the first emission signal, and the second emission signal may be off-level.

During the fourth driving period, the first to third scan signals may be off-level, the first emission signal and the second emission signal may be on-level, and the organic light emitting diode may emit light.

The second driving period may be at least two horizontal scanning times.

The hold period may include first to third driving periods.

During the first driving period, the first emission signal may be on-level, and the first to third scan signals and the second emission signal may be off-level.

During the second driving period, the third scan signal may be on-level, and the first scan signal, the second scan signal, the first emission signal, and the second emission signal may be off-level.

During the third driving period, the first to third scan signals may be off-level, the first emission signal and the second emission signal may be on-level, and the organic light emitting diode may emit light.

According to another aspect of the present disclosure, an organic light emitting display apparatus includes a display panel provided with a plurality of pixels including an organic light emitting diode and a pixel circuit, the pixel circuit includes a driving transistor, a first transistor, a second transistor, a third transistor, a fourth transistor, a fifth transistor, a sixth transistor, a seventh transistor, a first capacitor and a second capacitor. The pixel circuit includes a first node which is a gate electrode of the driving transistor, a second node to which one end of the first capacitor and one end of the second capacitor are connected, a third node which is a drain electrode of the driving transistor, a fourth node which is an anode electrode of the organic light emitting diode, and a fifth node which is a source electrode of the driving transistor. The first transistor is configured to supply a reference voltage to the first node in accordance with a first scan signal, the second transistor is configured to control electrical connection between the first node and a data line in accordance with a second scan signal. Further, the third transistor is configured to control electrical connection between the fifth node and a high potential voltage line in accordance with a first emission signal, the fourth transistor is configured to control electrical connection between the third node and the fourth node in accordance with a second emission signal, the fifth transistor is configured to supply a first bias voltage to the fourth node in accordance with a third scan signal, the sixth transistor is configured to supply a second bias voltage to the fifth node in accordance with a fourth scan signal, and the seventh transistor is configured to control electrical connection between the second node and the fifth node in accordance with a third emission signal. Further, the first capacitor is disposed between the first node and the second node, and the second capacitor may be located between a high potential voltage line and the second node.

Each of the first transistor and the second transistor may be an NMOS transistor.

Each of the first transistor and the second transistor may be oxide thin film transistors.

The fourth scan signal and the third emission signal may have reverse phases.

One frame may be divided into a refresh period in which a data voltage is written and a hold period in which the data voltage written in the refresh period is held.

The refresh period may include first to fifth driving periods.

During the first driving period, the fourth scan signal may be on-level, and the first to third scan signals and the first to third emission signals may be off-level.

During the second driving period, the first scan signal, the first emission signal, and the third emission signal may be on-level, and the second scan signal, the third scan signal, the fourth scan signal and the second emission signal may be off-level.

During the third driving period, the first scan signal, the third scan signal, the second emission signal, and the third emission signal may be on-level, and the second scan signal, the fourth scan signal and the first emission signal may be off-level.

During the fourth driving period, the second scan signal, the third scan signal, and the third emission signal may be on-level and the first scan signal, the fourth scan signal, the first emission signal, and the second emission signal may be off-level.

During the fifth driving period, the first to fourth scan signals may be off-level, the first to third emission signals may be on-level, and the organic light emitting diode may emit light.

The third driving period may be at least two horizontal scanning times.

The hold period includes first to third driving periods.

During the first driving period, the fourth scan signal may be on-level, and the first to third scan signals and the first to third emission signals may be off-level.

During the second driving period, the third scan signal and the third emission signal may be on-level and the first scan signal, the second scan signal, the fourth scan signal, the first emission signal, and the second emission signal may be off-level.

During the third driving period, the first to fourth scan signals may be off-level, the first to third emission signals may be on-level, and the organic light emitting diode may emit light.

The third scan signal may be pulsed to on-level a plurality of times, in one frame.

According to still another aspect of the present disclosure, an organic light emitting display apparatus includes an organic light emitting diode; and a pixel circuit including: a driving transistor configured to supply a driving current to the organic light emitting diode; a plurality of switching transistors configured to transmit a reference voltage and a data voltage to a gate electrode of the driving transistor, respectively; a plurality of emission transistors configured to connect a source electrode and a drain electrode of the driving transistor to a high potential voltage line and an anode electrode of the organic light emitting diode, respectively; and an anode reset transistors configured to transmit a first bias voltage to the anode electrode of the organic light emitting diode.

The pixel circuit may be driven by dividing one frame into a refresh period in which a data voltage is written and a hold period in which the data voltage written in the refresh period is held.

The refresh period may include an initialization period, a sampling period, a programming period, and an emission period, and the sampling period and the programming period are separated.

The sampling period may be at least two horizontal scanning times.

The pixel circuit may further include an on-bias stress transistor configured to transmit a second bias voltage to the source electrode of the driving transistor, and at least one of the refresh period and the hold period may include an on-bias stress period.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display apparatus, comprising:
   a display panel including a plurality of pixels, at least one of the plurality of pixels including an organic light emitting diode and a pixel circuit,
   wherein the pixel circuit includes a driving transistor, a first transistor, a second transistor, a third transistor, a fourth transistor, a fifth transistor, a first capacitor, a second capacitor, a first node which is a gate electrode of the driving transistor, a second node which is a source electrode of the driving transistor, a third node which is a drain electrode of the driving transistor, and a fourth node which is an anode electrode of the organic light emitting diode,
   wherein:
      the first transistor is configured to supply a reference voltage to the first node in accordance with a first scan signal,
      the second transistor is configured to control an electrical connection between the first node and a data line in accordance with a second scan signal,
      the third transistor is configured to control an electrical connection between the second node and a high potential voltage line in accordance with a first emission signal,
      the fourth transistor is configured to control an electrical connection between the third node and the fourth node in accordance with a second emission signal,
      the fifth transistor is configured to supply a first bias voltage to the fourth node in accordance with a third scan signal,
      the first capacitor is disposed between the first node and the second node, and
      the second capacitor is disposed between the high potential voltage line and the second node,
   wherein one frame is divided into a refresh period in which a data voltage is written and a hold period in which the data voltage written in the refresh period is held, the refresh period including a first driving period to a fourth driving period, and during the first driving period, the first transistor is on while the third transistor is on responsive to a gate electrode of the first transistor receiving the first scan signal at an on-level and a gate electrode of the third transistor receiving the first emission signal at the on-level, and the second transistor, the fourth transistor, and the fifth transistor are all turned off responsive to a gate electrode of the second transistor receiving the second scan signal at an off-level, a gate electrode of the fourth transistor receiving the second emission signal at the off-level, and a gate electrode of the fifth transistor receiving the third scan signal at the off-level.

2. The organic light emitting display apparatus according to claim 1,
wherein each of the first transistor and the second transistor is an oxide thin film transistor.

3. The organic light emitting display apparatus according to claim 1,
wherein each of the first transistor and the second transistor is an NMOS transistor.

4. The organic light emitting display apparatus according to claim 1,
wherein each of the third transistor, the fourth transistor, and the fifth transistor is a low-temperature polycrystalline silicon thin film transistor.

5. The organic light emitting display apparatus according to claim 1,
wherein one frame is divided into a refresh period in which a data voltage is written and a hold period in which the data voltage written in the refresh period is held.

6. The organic light emitting display apparatus according to claim 5,
wherein the refresh period includes a first driving period to a fourth driving period, during the second driving period, the first transistor is on while the driving transistor, the fourth transistor, and the fifth transistor are on responsive to the gate electrode of the first transistor receiving the first scan signal at the on-level, the gate electrode of the fifth transistor receiving the third scan signal at the on-level, and gate electrode of the fourth transistor receiving the second emission signal at the on-level, and the second transistor is off while the third transistor is off responsive to the gate electrode of the second transistor receiving the second scan signal at the off-level and the gate electrode of the third transistor receiving the first emission signal at the off-level, during the third driving period, the second transistor is on while the fifth transistor is on responsive to the gate electrode of the second transistor receiving the second scan signal at the on-level and the gate electrode of the fifth transistor receiving the third scan signal at the on-level, and the first transistor is off while the third transistor and the fourth transistor are off responsive to the gate electrode of the first transistor receiving the first scan signal at the off-level, the gate electrode of the third transistor receiving the first emission signal at the off-level, and the gate electrode of the fourth transistor receiving the second emission signal at the off-level, and during the fourth driving period, the first transistor is off while the second transistor and the fifth transistor are off responsive to the gate electrode of the first transistor receiving the first scan signal at the off-level, the gate electrode of the second transistor receiving the second scan signal at the off-level, and the gate electrode of the fifth transistor receiving the third scan signal at the off-level, and the third transistor is on while the fourth transistor is on responsive to the gate electrode of the third transistor receiving the first emission signal at the on-level and the gate electrode of the fourth transistor receiving the second emission signal at the on-level, and the organic light emitting diode emits light.

7. The organic light emitting display apparatus according to claim 6,
wherein the second driving period is at least two horizontal scanning times.

8. The organic light emitting display apparatus according to claim 5,
wherein the hold period includes a first driving period to a third driving period, during the first driving period, the third transistor is turned on responsive to a gate electrode of the third transistor receiving the first emission signal at an on-level, the first transistor is turned off responsive to a gate electrode of the first transistor receiving the first scan signal at the off-level, the second transistor is turned off responsive to a gate electrode of the second transistor receiving the second scan signal at the off-level, the fifth transistor is turned off responsive to a gate electrode of the fifth transistor receiving the third scan signal at the off-level, and the fourth transistor is turned off responsive to a gate electrode of the fourth transistor receiving the second emission signal at the off-level, during the second driving period, the fifth transistor is turned on responsive to the gate electrode of the fifth transistor receiving the third scan signal at the on-level, the first transistor is turned off responsive to the gate electrode of the first transistor receiving the first scan signal at the off-level, the second transistor is turned off responsive to the gate electrode of the second transistor receiving the second scan signal at the off-level, the third transistor is turned off responsive to the gate electrode of the third transistor receiving the first emission signal at the off-level, and the fourth transistor is turned off responsive to the gate electrode of the fourth transistor receiving the second emission signal at the off-level, and during the third driving period, the first transistor is turned off responsive to the gate electrode of the first transistor receiving the first scan signal at the off-level, the second transistor is turned off responsive to the gate electrode of the second transistor receiving the second scan signal at the off-level, and the fifth transistor is turned off responsive to the gate electrode of the fifth transistor receiving the third scan signal at the off-level, and the third transistor is turned on responsive to the gate electrode of the third transistor receiving the first emission signal at the on-level and the fourth transistor is turned on responsive to the gate electrode of the fourth transistor receiving the second emission signal at the on-level, and the organic light emitting diode emits light.

9. An organic light emitting display apparatus, comprising:
a display panel including a plurality of pixels, at least one of the plurality of pixels including an organic light emitting diode and a pixel circuit,
wherein the pixel circuit includes a driving transistor, a first transistor, a second transistor, a third transistor, a fourth transistor, a fifth transistor, a sixth transistor, a seventh transistor, a first capacitor, a second capacitor, a first node which is a gate electrode of the driving transistor, a second node to which one end of the first capacitor and one end of the second capacitor are connected, a third node which is a drain electrode of the driving transistor, a fourth node which is an anode electrode of the organic light emitting diode, and a fifth node which is a source electrode of the driving transistor, wherein:
the first transistor is configured to supply a reference voltage to the first node in accordance with a first scan signal,
the second transistor is configured to control an electrical connection between the first node and a data line in accordance with a second scan signal,
the third transistor is configured to control an electrical connection between the fifth node and a high potential voltage line in accordance with a first emission signal,
the fourth transistor is configured to control an electrical connection between the third node and the fourth node in accordance with a second emission signal,
the fifth transistor is configured to supply a first bias voltage to the fourth node in accordance with a third scan signal,
the sixth transistor is configured to supply a second bias voltage to the fifth node in accordance with a fourth scan signal,
the seventh transistor is configured to control an electrical connection between the second node and the fifth node in accordance with a third emission signal,
the first capacitor is disposed between the first node and the second node, and
the second capacitor is disposed between the high potential voltage line and the second node,
wherein one frame is divided into a refresh period in which a data voltage is written and a hold period in which the data voltage written in the refresh period is held, the refresh period including a first driving period to a fifth driving period, and
during the second driving period that is after the first driving period, the first transistor is on while the third transistor is on responsive to a gate electrode of the first transistor receiving the first scan signal at an on-level and a gate electrode of the third transistor receiving the first emission signal at the on-level, and the second transistor, the fourth transistor, and the fifth transistor are all turned off responsive to a gate electrode of the second transistor receiving the second scan signal at an off-level, a gate electrode of the fourth transistor receiving the second emission signal at the off-level, and a gate electrode of the fifth transistor receiving the third scan signal at the off-level.

10. The organic light emitting display apparatus according to claim 9,
wherein each of the first transistor and the second transistor is an oxide thin film transistor.

11. The organic light emitting display apparatus according to claim 9,
wherein each of the first transistor and the second transistor is an NMOS transistor.

12. The organic light emitting display apparatus according to claim 9,
wherein the fourth scan signal and the third emission signal have reverse phases.

13. The organic light emitting display apparatus according to claim 9,
wherein one frame is divided into a refresh period in which a data voltage is written and a hold period in which the data voltage written in the refresh period is held.

14. The organic light emitting display apparatus according to claim 13,
during the first driving period, the sixth transistor is turned on responsive to the gate electrode of the sixth transistor receiving the fourth scan signal at the on-level, and the first transistor, the second transistor, the third transistor, the fourth transistor, the fifth transistor, and the seventh transistor are turned off responsive to the gate electrode of the first transistor receiving the first scan signal at the off-level, the gate electrode of the second transistor receiving the second scan signal at the off-level, the gate electrode of the fifth transistor receiving the third scan signal at the off-level, the gate electrode of the third transistor receiving the first emission signal at the off-level, the gate electrode of the fourth transistor receiving the second emission signal at the off-level, and the gate electrode of the seventh transistor receiving the third emission signal at the off-level,
during the third driving period, the first transistor, the fifth transistor, the fourth transistor, and the seventh transistor are turned on responsive to the gate electrode of the first transistor receiving the first scan signal at the on-level, the gate electrode of the fifth transistor receiving the third scan signal at the on-level, the gate electrode of the fourth transistor receiving the second emission signal at the on-level, and the gate electrode of the seventh transistor receiving the third emission signal at the on-level, and the second transistor, the sixth transistor, and the third transistor are turned off responsive to the gate electrode of the second transistor receiving the second scan signal at the off-level, the gate electrode of the sixth transistor receiving the fourth scan signal at the off-level, and the gate electrode of the third transistor receiving the first emission signal are at the off-level,
during the fourth driving period, the second transistor and the seventh transistor are turned on responsive to the gate electrode of the second transistor receiving the second scan signal at the on-level and the gate electrode of the seventh transistor receiving the third emission signal at the on-level, and the first transistor, the sixth transistor, the third transistor, and the fourth transistor are turned off responsive to the gate electrode of the first transistor receiving the first scan signal at the off-level, the gate electrode of the sixth transistor receiving the fourth scan signal at the off-level, the gate electrode of the third transistor receiving the first emission signal at the off-level, and the gate electrode of the fourth transistor receiving the second emission signal at the off-level, and
during the fifth driving period, the first transistor, the second transistor, the fifth transistor, and the sixth transistor are turned off responsive to the gate electrode of the first transistor receiving the first scan signal at the off-level, the gate electrode of the second transistor receiving the second scan signal at the off-level, the gate electrode of the fifth transistor receiving the third scan signal at the off-level, and the gate electrode of the sixth transistor receiving the fourth scan signal at the off-level, and the third transistor, the fourth transistor, and the seventh transistor are turned on responsive to the gate electrode of the third transistor receiving the first emission signal at the on-level, the gate electrode of the fourth transistor receiving the second emission signal at the on-level, and the gate electrode of the seventh transistor receiving the third emission signal at the on-level, and the organic light emitting diode emits light.

15. The organic light emitting display apparatus according to claim 14,
wherein the third driving period is at least two horizontal scanning times.

16. The organic light emitting display apparatus according to claim 13,
wherein the hold period includes a first driving period to a third driving period,
during the first driving period, the sixth transistor is turned on responsive to the gate electrode of the sixth transistor receiving the fourth scan signal at an on-level, and the first transistor, the second transistor, the third transistor, the fourth transistor, the fifth transistor, and the seventh transistor are turned off responsive to the gate electrode of the first transistor receiving the first scan signal at the off-level, the gate electrode of the second transistor receiving the second scan signal at the off-level, the gate electrode of the fifth transistor receiving the third scan signal at the off-level, the gate electrode of the sixth transistor receiving the fourth scan signal at the off-level, the gate electrode of the third transistor receiving the first emission signal at the off-level, the gate electrode of the fourth transistor receiving the second emission signal at the off-level, and the gate electrode of the seventh transistor receiving the third emission signal at the off-level,
during the second driving period, the fifth transistor and the seventh transistor are turned on responsive to the gate electrode of the fifth transistor receiving the third scan signal at the on-level and the gate electrode of the seventh transistor receiving the third emission signal at the on-level and the first transistor, the second transistor, the sixth transistor, the third transistor, and the fourth transistor are turned off responsive to the gate electrode of the first transistor receiving the first scan signal at the off-level, the gate electrode of the second transistor receiving the second scan signal at the off-level, the gate electrode of the sixth transistor receiving the fourth scan signal at the off-level, the gate electrode of the third transistor receiving the first emission signal at the off-level, and the gate electrode of the fourth transistor receiving the second emission signal at the off-level, and
during the third driving period, the first transistor, the second transistor, the fifth transistor, and the sixth transistor are turned off responsive to the gate electrode of the first transistor receiving the first scan signal at the off-level, the gate electrode of the second transistor receiving the second scan signal at the off-level, the gate electrode of the fifth transistor receiving the third scan signal at the off-level, and the gate electrode of the sixth transistor receiving the fourth scan signal at the off-level, and the third transistor, the fourth transistor, and the seventh transistor are turned on responsive to the gate electrode of the third transistor receiving the first emission signal at the on-level, the gate electrode of the fourth transistor receiving the second emission signal at the on-level, and the gate electrode of the seventh transistor receiving the third emission signal at the on-level, and the organic light emitting diode emits light.

17. The organic light emitting display apparatus according to claim 9,
wherein the third scan signal is pulsed to an on-level a plurality of times, in one frame.

18. An organic light emitting display apparatus, comprising:
an organic light emitting diode;
a pixel circuit including:
a driving transistor configured to supply a driving current to the organic light emitting diode;
a plurality of switching transistors including a first transistor connected to a gate electrode of the driving transistor and configured to transmit a reference voltage to the gate electrode of the driving transistor in accordance with a first scan signal, and a second transistor connected to the first transistor and the gate electrode of the driving transistor and configured to transmit a data voltage to gate electrode of the driving transistor in accordance with a second scan signal;
a plurality of emission transistors including a third transistor connected to a high potential voltage line and a source electrode of the driving transistor and configured to control an electrical connection between the source electrode of the driving transistor and the high potential voltage line in accordance with a first emission signal and a fourth transistor connected to a drain electrode of the driving transistor and an anode electrode of the organic light emitting diode and configured to control an electrical connection between the drain electrode of the driving transistor and the anode electrode in accordance with a second emission signal; and
an anode reset transistor configured to transmit a first bias voltage to the anode electrode of the organic light emitting diode,
wherein one frame is divided into a refresh period in which a data voltage is written and a hold period in which the data voltage written in the refresh period is held, the refresh period including an initialization period, a sampling period, a programming period, and an emission period, and
during the initialization period, the first transistor is on while the third transistor is on responsive to a gate electrode of the first transistor receiving the first scan signal at an on-level and a gate electrode of the third transistor receiving the first emission signal at an on-level, and the second transistor, and the fourth transistor are all turned off responsive to a gate electrode of the second transistor receiving the second scan signal at an off-level, and a gate electrode of the fourth transistor receiving the second emission signal at the off-level.

19. The organic light emitting display apparatus according to claim 18,
wherein the sampling period and the programming period are separated.

20. The organic light emitting display apparatus according to claim 19,
wherein the sampling period is at least two horizontal scanning times.

21. The organic light emitting display apparatus according to claim 18, wherein the pixel circuit further includes an on-bias stress transistor configured to transmit a second bias voltage to the source electrode of the driving transistor, and
wherein at least one of the refresh period or the hold period includes an on-bias stress period.

* * * * *